(12) United States Patent
Chang et al.

(10) Patent No.: US 8,994,406 B2
(45) Date of Patent: Mar. 31, 2015

(54) DIGITAL CELL

(71) Applicant: Nanyang Technological University, Singapore (SG)

(72) Inventors: Joseph Sylvester Chang, Singapore (SG); Bah Hwee Gwee, Singapore (SG); Kwen Siong Chong, Singapore (SG)

(73) Assignee: Nanyang Technological University, Singapore (SG)

( * ) Notice: Subject to any disclaimer, the term of this patent is extended or adjusted under 35 U.S.C. 154(b) by 209 days.

(21) Appl. No.: 13/720,867

(22) Filed: Dec. 19, 2012

(65) Prior Publication Data

US 2013/0342253 A1 Dec. 26, 2013

Related U.S. Application Data

(60) Provisional application No. 61/577,367, filed on Dec. 19, 2011.

(51) Int. Cl.
*H03K 19/094* (2006.01)
*H03K 3/02* (2006.01)
*H03K 17/16* (2006.01)
*H03K 19/0185* (2006.01)
*H03K 19/20* (2006.01)

(52) U.S. Cl.
CPC .......... *H03K 17/165* (2013.01); *H03K 19/0185* (2013.01); *H03K 19/20* (2013.01)
USPC ............... 326/112; 326/115; 326/121; 326/9; 327/198; 327/51

(58) Field of Classification Search
USPC ................. 326/9, 38, 62, 112, 115, 121, 122; 327/51–57, 198; 365/205–208
See application file for complete search history.

(56) References Cited

U.S. PATENT DOCUMENTS

| | | | | |
|---|---|---|---|---|
| 6,573,772 B1 * | 6/2003 | Dai et al. | ....................... | 327/172 |
| 6,816,554 B1 * | 11/2004 | Zhang | ............................ | 375/257 |
| 7,362,153 B2 * | 4/2008 | Sumesaglam | ................. | 327/202 |
| 7,934,031 B2 * | 4/2011 | Lines et al. | ..................... | 710/100 |
| 8,051,396 B2 * | 11/2011 | Beerel et al. | .................. | 716/104 |
| 8,254,194 B2 * | 8/2012 | Giambartino et al. | ........ | 365/207 |
| 8,605,516 B2 * | 12/2013 | Moore et al. | .................. | 365/188 |
| 8,791,717 B2 * | 7/2014 | Chang et al. | .................... | 326/26 |

* cited by examiner

*Primary Examiner* — Vibol Tan
(74) *Attorney, Agent, or Firm* — Foley & Lardner LLP

(57) ABSTRACT

A digital cell for performing a logic operation on a logic input to produce a logic output, includes an evaluation block and a sense-amplifier block, both configured to receive input signals representative of the logic input, and to detect when the logic input and/or input signals validly encode at least one bit. The digital cell is configured to alternate between an evaluate state and a reset state. Upon the digital cell being in the reset state and the detection, the digital cell is switched from the reset state to the evaluate state in which the evaluation block generates a difference in its output signals, and the sense-amplifier block amplifies the difference so that the output signals encode at least one valid bit. Upon the digital cell being in the evaluate state, the digital cell can be triggered to reset to the reset state.

24 Claims, 20 Drawing Sheets

DIGITAL CELL

CLAIM FOR PRIORITY

The present application claims benefit of U.S. Provisional Patent Application Ser. No. 61/577,367 filed on Dec. 19, 2011, the entire disclosure of which is incorporated herein by reference.

FIELD OF THE INVENTION

The present invention relates to a digital cell for performing a logic operation and a pipeline comprising at least one such digital cell.

BACKGROUND OF THE INVENTION

There is a continuing need for digital circuits and systems which are high-speed, robust (i.e. error-free under all possible operating conditions regardless of the fabrication process used and variations thereof), and have low power dissipation. In recent years, this need has become stronger due to the increasing demand for portable electronic devices to have longer battery lives, increased functionality/intelligence within a given power budget, and operational robustness/accuracy. Examples of such portable electronic devices include cellular phones, notebooks, audio players, smart cards, network sensors, bio-medical devices, security and military devices, etc.

The EMI (Electromagnetic Interference) of electronic devices is also an important design issue. Virtually all electronic devices have to meet certain electromagnetic compatibility (EMC) standards before they can be marketed. Furthermore, some security and military applications, for example cryptography applications, require ultra low Electromagnetic Interference (EMI) as EMI is one of the common information used by hackers to decipher security data present in these applications.

Therefore, digital circuits and systems having simultaneously operational robustness, high-speed, low power dissipation and low EMI attributes are highly desirable in the manufacture of electronic devices for today's applications. However, digital circuits and systems operating at high speeds are switching fast and hence, their power dissipation and EMI tend to be higher. To date, design techniques attempting to overcome this have been developed but the performance of these techniques remains unsatisfactory. Such design techniques can be broadly categorized into synchronous-logic-based techniques and asynchronous-logic-based techniques as described below.

Synchronous-Logic-Based Techniques

Since the Moore's law was conceptualized in 1965, several techniques aiming to achieve digital circuits and systems with high speeds and low power dissipation have been developed based on the synchronous-logic design methodology in which a global clock signal (or its variants) is used to synchronize digital operations. Details of synchronous-logic design methodology can be found in J. M Rabaey et al. [5].

In particular, one of the key design issues in synchronous-logic design methodology relates to achieving robust operations under the synchronous operational modality where a pre-defined clock timing closure needs to be strictly abided by. More specifically, each digital operation has to be computed and ready within a clock period. To achieve a digital circuit or system which abides by the pre-defined clock timing closure, several clock-relevant timing assumptions under various possible process and operating conditions (generally termed as Process-Voltage-Temperature (PVT) variations) have to be made. The digital circuit or system can only be robust if these timing assumptions hold.

Besides using design methods aiming to reduce switched capacitances and switching activities at different levels (spanning from the system-level down to the layout- or device-layer), current techniques based on the synchronous-logic design methodology also use transistors with smaller feature sizes (achieved with advanced deep submicron or nano-scaled silicon fabrication processes) as this allows the scaling down of the supply voltages. However, it is well-known that PVT variations in digital circuits and systems tend to increase as the feature sizes of transistors in the circuits and systems are scaled downwards. This in turn results in larger electrical variations in the digital circuits and systems, affecting the validity of the timing assumptions.

Table I shows the possible effects of smaller transistor feature sizes on electrical variations in digital circuits. More specifically, Table I is obtained from the International Technology Roadmap for Semiconductors in year 2011 (ITRS-2011) and tabulates possible electrical variations in digital circuits if these circuits are fabricated using current and possible future fabrication processes. The electrical variations in Table I are expressed in terms of the variations in the process parameters (% Process Parameter Uncertainty), variations in the threshold voltage including all sources of such variations (% $V_t$ variability; all sources), variations in the circuit performance e.g. the circuit delay (% Circuit performance variability), variations in the total power consumption (% Circuit total power variability) and variations in the power leakage (% Circuit leakage power variability). As can be seen from Table I, the electrical variations in the digital circuits are expected to increase as the feature sizes of the transistors in the circuits decrease (from 40 nm to 6.3 nm).

TABLE I

| | 2011 | 2012 | 2013 | 2014 | 2015 | ... | 2026 |
|---|---|---|---|---|---|---|---|
| Fabrication Process | 40 nm | 32 nm | 28 nm | 24 nm | 21 nm | ... | 6.3 nm |
| % Process Parameter Uncertainty | 11% | 12% | 14% | 15% | 18% | ... | 38% |
| % $V_t$ variability; all sources | 42% | 42% | 42% | 47% | 47% | ... | 79% |
| % Circuit performance variability | 42% | 42% | 42% | 45% | 45% | ... | 60% |
| % Circuit total power variability | 51% | 51% | 51% | 55% | 55% | ... | 81% |
| % Circuit leakage power variability | 126% | 126% | 126% | 129% | 129% | ... | 148% |

The possible effects of smaller transistor feature sizes on electrical variations in digital circuits are further illustrated in FIGS. 1(a) and (b). In particular, FIG. 1(a) illustrates the possible soft error rates of two digital circuit types (the inverter and the clocked latch) at nominal supply voltage if these circuit types are fabricated using current and possible future fabrication process technologies. FIG. 1(b) illustrates the possible soft error rates of the clocked latch at different supply voltages $V_{DD}$ if the clocked latch is fabricated using the 16 nm, 22 nm and 32 nm process technologies. More specifically, FIG. 1(b) shows how the soft error rates of each clocked latch fabricated using a different technology are expected to change as the supply voltage $V_{DD}$ is varied within ±10%. The soft error rates shown in FIGS. 1(a)-(b) are also obtained from the ITRS-2011.

To a certain extent, the inverter can be seen as a representative of combinational logic as it is present in virtually all digital circuits and systems, whereas the clocked latch can be seen as a representative of sequential logic as it is one of the critical building blocks for synchronous-logic circuits and systems. From FIG. 1(a), it can be seen that as the feature sizes of the transistors decrease, the error rates for both the clocked latch and the inverter are expected to increase. This can also be seen from FIG. 1(b) which shows the clocked latch fabricated with 16 nm CMOS technology having the highest predicted soft error rates for all supply voltages. FIG. 1(b) also shows that regardless of the fabrication process technology, the error rates of the clocked latch are expected to increase as the supply voltage $V_{DD}$ decreases.

Furthermore, FIG. 1(a) allows a comparison between the error rates of the clocked latch and that of the inverter. The inverter serves as a good circuit type for comparison of error rates, as it is a simple digital circuit and hence, its error rate can be used as the lowest bound for the error rates of digital circuits. From FIG. 1(a), it can be seen that the clocked latch has significantly more operational errors than the inverter. This is probably due to the clock synchronization issues which are present in the clocked latch but not in the inverter. In particular, for the 12 nm process technology which may possibly be available in future, the error rate of the clocked latch can reach above 10%. This can potentially cause difficulties in designing the digital circuit.

Robust operations can only be guaranteed if the PVT variations issues are fully addressed. However, it is difficult to ensure this and thus, "pessimistic" design practices with large safety timing margins are usually adopted for synchronous-logic circuits and systems. Such design practices tend to slow down the operations of the synchronous-logic circuits and systems.

Furthermore, although under a pre-defined clock timing closure (clock skew, setup-time, hold-time, critical-path timing etc.), a synchronous-logic circuit or system could theoretically be clocked to its maximum speed, such a circuit or system is impractical. This is because the clock infrastructure of a synchronous-logic circuit or system is often "power-hungry" i.e. consumes a large amount of power and this amount of power consumed by the clock infrastructure tends to increase as the clock frequency increases. This in turn results in high power dissipation, causing reliability or packaging issues. Furthermore, a synchronous-logic circuit or system clocked at a high speed tends to emit high EMI as a large amount of current is drawn virtually simultaneously during every clock edge. Therefore, the potential of synchronous-logic circuits and systems in achieving high-speed digital operations is limited, as reflected in how clock frequencies of microprocessors have "stalled" at 1 GHz to 3 GHz for several years.

To date, design issues relating to PVT variations, speed, power dissipation and EMI of synchronous-logic digital circuits and systems are only in part addressed. A brief summary of techniques that have been developed to address these issues is provided below.

In particular, example techniques that have been used to alleviate the impact of PVT variations on the robustness of digital circuits and systems include highly controlled but expensive fabrication processes, closed-loop monitoring circuitry and adaptive biasing etc. In general, these techniques attempt to reduce the PVT variations and timing variations of the digital circuits and systems by means of better fabrication technologies and/or intensive statistical timing analyses. An overview of these techniques can be found in references [1] and [10]-[13].

To improve speed, current digital circuits and systems often adopt nano-scaled fabrication methods, together with techniques such as aggressive timing control, parallelism and pipelining, and dynamic logic etc. The premise of these techniques is to reasonably predict the computation times required by the digital operations, and to reduce the delays of these operations as much as possible. A good overview of these techniques can be found in references [5], [8], [9] and [12].

The use of nano-scaled fabrication methods also help to reduce power dissipation. On top of these methods, current digital circuits and systems also often adopt techniques such as dynamic voltage and frequency scaling, clock gating, power gating, multi-threshold control, parallelism and pipelining etc. to further reduce the power dissipation. The premise of these techniques is to reduce operating supply voltages, switching activities, switching frequencies, parasitic capacitance and leakage currents. A good overview of these techniques can be found in references [5] and [14]-[16].

To reduce EMI, techniques such as using careful layout implementations, using clock synthesis, shielding, increasing wire spacing to reduce transmission line effect etc. are often adopted. A good overview of these techniques can be found in references [5] and [20].

Note that although the above-mentioned techniques are largely intended for synchronous-logic circuits and systems, some of the techniques may also be used for hybrid synchronous/asynchronous-logic circuits and systems.

Despite the development of the above techniques, digital circuits and systems based on synchronous-logic design methodology (and those based on hybrid synchronous/asynchronous-logic design methodology) are still unsatisfactory. Due to the large timing variations in circuits and systems fabricated by nano-scaled fabrication processes, it remains challenging to realize synchronous-logic circuits and systems that fully satisfy the timing assumptions. In fact, robust high-speed operations in synchronous-logic circuits and systems would almost never be guaranteed unless the PVT variations issues have been fully addressed. Furthermore, due to their complex clock infrastructure, synchronous-logic circuits and systems still tend to have high power dissipation and high EMI. To alleviate the effects of the PVT variations and the complex clock infrastructure, the speeds of synchronous-logic circuits and systems often have to be compromised.

Asynchronous-Logic-Based Techniques

The asynchronous-logic approach is in some ways advantageous over the synchronous-logic approach as it allows for more design simplicity and operational robustness. This is largely because asynchronous-logic circuits and systems are self-timed i.e. there is no need for a global clock signal for data synchronization. Instead, the asynchronous-logic approach achieves data synchronization by using a set of handshake protocols. Using the asynchronous-logic approach also helps in achieving lower EMI. This is because while synchronous-logic digital operations are synchronized at the same time which can potentially lead to high current spikes (and hence, higher EMI), asynchronous-logic digital operations are distributed across time, resulting in a smaller rate of change in current (and hence lower EMI).

Details of asynchronous-logic circuits and design methodology can be found in J. Sparso et al. [6]. In particular, FIG. 2 shows the categorization of design techniques for implementing digital circuits with these techniques being classified into synchronous-logic-based and asynchronous-logic-based techniques at the highest level, and with the asynchronous-logic-based techniques being further classified according to the class of asynchronous-logic approach they belong to. In general, there are three classes of asynchronous-logic approaches comprising (1) the delay-insensitive approach in the first class, (2) the quasi-delay-insensitive (QDI) and speed-independent approaches in the second class, and (3) the matched-delay approach in the third class. These approaches are elaborated below.

The delay-insensitive approach requires the digital circuits to adhere to a strict delay property. Although the resulting delay-insensitive circuits can operate perfectly even in the presence of gate and/or wire delays, it is difficult to realize such circuits. As a result, delay-insensitive circuits generally comprise only C-Muller circuits. Hence, the delay-insensitive approach is impractical.

The matched-delay approach is in some sense similar to the synchronous-logic approach in that timing assumptions are required and "pessimistic" design practices with large safety timing margins have to be adopted to ensure robust operations. In particular, the matched-delay approach works by placing bounds on wire and/or gate delays so as to match the delay of delay lines to that of associated combinational circuits. However, it is often difficult to achieve a good match between the aforementioned delays due to PVT variations in the digital circuits and systems. Hence, it is difficult to achieve operational robustness in matched-delay circuits without adopting the "pessimistic" design practices.

The speed-independent and QDI approaches are grouped together under one class as they have similar self-detection mechanisms. Theoretically, both speed-independent circuits and QDI circuits can achieve operational robustness even in the presence of gate delays in the circuits. However, the speed-independent approach works based on the assumption that all wire delays are negligible. With current nano-scaled fabrication processes, this is an unrealistic assumption. On the other hand, QDI circuits work by innately detecting computational delays that arise due to different workloads and operating conditions. This helps in accommodating the PVT variations, thereby achieving design simplicity and increasing operational robustness. The only timing assumption in the QDI approach is the "isochronic forks" assumption, that is, branched wires from a wire node are assumed to have the same wire delays. Such a timing assumption can be fulfilled in practice. Therefore, as compared to the other asynchronous-logic approaches, the QDI approach is probably the most suitable approach for today's applications to innately address PVT variations.

Operation of a QDI Circuit

The following provides a brief overview of the operation of a QDI circuit.

A QDI circuit usually uses dual-rail data encoding in which two wires (or rails) are used to encode a data signal. Table II shows this dual-rail data encoding.

TABLE II

|  | D.T (first rail) | D.F (second rail) |
| --- | --- | --- |
| Valid '0' | 0 | 1 |
| Valid '1' | 1 | 0 |
| Null ('0' reset) | 0 | 0 |
| Null ('1' reset) | 1 | 1 |

In particular, the first and second rails respectively represent dual-rail data D.T and D.F. When both rails are in the same logic states (either both D.T and D.F are at logic '0' for the '0' reset encoding or both D.T and D.F are at logic '1' for the '1' reset encoding), the data signal the rails encode is considered "null" or in other words, "empty". Conversely, when the rails are in opposite logic states (i.e. D.T is at logic '1' while D.F is at logic '0', or D.T is at logic '0' while D.F is at logic '1'), the data signal is considered "valid". In particular, D.T at logic '1' and D.F at logic '0' encodes a valid '1' signal, whereas D.T at logic '0' and D.F at logic '1' encodes a valid '0' signal.

Note that in this document, the dual-rail data D.T, D.F are considered "empty" when they are at logic states indicating that the data signal is "empty" (i.e. when D.T='0', D.F='0' for the '0' reset encoding or when D.T='1', D.F='1' for the '1' reset encoding). When any one of the dual-rail data D.T, D.F is asserted indicating either a valid '0' signal or a valid '1' signal (i.e. when D.T is at logic '1' and D.F is at logic '0', or when D.T is at logic '0' and D.F is at logic '1'), the dual-rail data D.T, D.F are considered "valid".

In general, a QDI circuit is configured to receive dual-rail input signals encoding a logic input and provide dual-rail output signals encoding a logic output. The QDI circuit is also configured to operate either in an initialization mode or in an active mode, and in the active mode, is further configured to alternate between a reset state (which the circuit enters after performing a reset operation) and an evaluate state (in which the circuit performs an evaluation operation). Basically, in the initialization mode, a QDI circuit is in a pre-defined condition having the same output signaling as when it is in the reset state in the active mode. The QDI circuit enters the initialization mode only once after a global reset of the system (i.e. after the entire system, including the QDI circuit and other logic gates, is initialized). In the active mode, the QDI circuit is switched from the reset state to the evaluate state upon detection of a valid logic input, and is switched from the evaluate state to the reset state upon detection of an empty logic input. Usually, the alternating of the QDI circuit is not just based on the logic input but is further based on one or more handshake signals. These handshake signals may in turn be based on the logic input and/or output of the QDI circuit, or that of one or more adjoining QDI circuits. Thus, dual rails encoding each data signal in a QDI circuit can be said to not only encode the state of the data signal but also carry timing information to control the alternating of the QDI circuit between the two states. With this, the commencement and completion of operations in QDI circuits can be easily detected.

A more specific description of how a QDI circuit operates is provided below. The QDI circuit may first be initialized by a global reset to the initialization mode. In the initialization mode, the logic input is empty. The QDI circuit remains in the initialization mode until the global reset is released, and thereafter, the QDI circuit enters the active mode. In the active mode, the QDI circuit performs two operations—an evaluation operation in the evaluate state and a reset operation to return to the reset state. Initially (upon the release of the global reset), the QDI circuit is in the reset state. Upon receiving a valid logic input (and when the handshake signal(s) indicate that the QDI circuit is ready for the evaluation operation), the QDI circuit enters the evaluate state and performs the evaluation operation on the valid logic input to produce a valid logic output. When the logic input becomes empty again (and when the handshake signal(s) indicate that the QDI circuit is ready for the reset operation), the reset operation is performed for the QDI circuit to return to the reset state.

Pipeline Structures in which QDI Circuits can be Adopted

As shown in FIG. 2, QDI approaches can be further classified based on the pipeline structures they are applicable to. A pipeline structure generally comprises a Datapath and a Controller, whereby the Datapath allows the flow of data through the pipeline to perform operations and the Controller controls this flow of data.

In general, there are two asynchronous-logic pipeline structures in which QDI circuits can be adopted—the Data-Control Decomposition pipeline structure and the Integrated-Latch pipeline structure. These structures differ from each other in that in the Data-Control Decomposition pipeline structure, the Controller and Datapath are separated whereas in the Integrated-Latch pipeline structure, the Controller and Datapath are integrated. This is elaborated below with reference to FIGS. 3 and 4.

In particular, FIG. 3 shows a block diagram of the Data-Control Decomposition pipeline structure in which the Controller (QDI controller circuit comprising the asynchronous-logic controllers including latches, latch controller and input completion detection circuits (ICD)) is separated from the Datapath (QDI circuits). The logic input is indicated as Input and is in the dual rail format. Upon detecting that the logic input is valid, the circuit of FIG. 3 generates a logic output shown as Output in the dual rail format, and a signal $L_{ack}$ which indicates that the signal is valid. The signal $L_{ack}$ is passed to the cell of the previous pipeline to act as $R_{ack}$ for that cell. The circuit continues to hold the logic output, Output. When a handshake signal $R_{ack}$ is received, it indicates that Output has been consumed by the succeeding pipeline and the circuit can stop holding the logic output, Output. The circuit of FIG. 3 allows the Controller and the Datapath to be designed independently and in turn allows a simpler realization of the pipeline. However, pipelines based on this structure tend to be slow (or speed-inefficient) as the grouping of many QDI circuits together results in a long critical delay path.

Examples of QDI approaches applicable to the Data-Control Decomposition pipeline structure include the Delay-Insensitive Minterm Synthesis (DIMS) approach, NULL Convention Logic (NCL) approach, Pre-charged Static Logic (PSCL) approach and those using a combination of these aforementioned approaches. More details on the Data-Control Decomposition pipeline structure and the QDI realizations for this pipeline structure can be found in references [2], [3], [6], [17] and [18].

In contrast, the Integrated-Latch pipeline structure integrates the Controller and the Datapath by incorporating an asynchronous-logic controller into each QDI circuit (logic cell) to form a micro-cell level pipeline circuit. The resulting QDI circuit may be referred to as an "Integrated-Latch QDI circuit". FIG. 4 shows an example of such an "Integrated-Latch QDI circuit" with its generic interface signals. The terms Input, Output, $L_{ack}$ and $R_{ack}$ have the same meaning as in FIG. 3. As compared to a pipeline based on the Data-Control Decomposition pipeline structure, a pipeline based on the Integrated-Latch pipeline structure has a shorter critical delay path and therefore, operates faster. In fact, depending on the logic depth within the pipeline, the speed of a pipeline based on the Integrated-Latch pipeline structure can be 10×-100× higher (in terms of throughput rate) than that of a pipeline based on the Data-Control Decomposition pipeline structure. In an Integrated-Latch QDI pipeline, besides detecting the commencement and completion of operations in each QDI circuit, it is also necessary to address the "input completeness" issue and the "gate orphan" issue to preserve the quasi-delay-insensitivity attribute of the pipeline. More specifically, the "input completeness" issue refers to the need for all inputs to each QDI circuit to be acknowledged before a new pipeline operation is commenced, whereas the "gate orphan" issue refers to the need to avoid occurrences of "gate orphans" (a "gate orphan" occurs when an internal gate is enabled to switch its output but this switching is masked from the observable outputs of the entire circuit).

An example QDI approach applicable to the Integrated-Latch pipeline structure is the Pre-Charged Half Buffers (PCHB) approach. FIG. 5 shows a buffer cell implemented based on the PCHB approach. In particular, the buffer cell in FIG. 5 receives dual-rail input signals A.T, A.F, provides dual-rail output signals Q.T, Q.F and operates using the left- and right-channel handshake signals $L_{ack}$, $R_{ack}$. Furthermore, the buffer cell comprises an "Input detection" circuit 502 for addressing the "input completeness" issue as mentioned above. In particular, this "Input detection" circuit 502 comprises an OR gate configured to receive the input signals A.T and A.F. Furthermore, the buffer cell in FIG. 5 is designed such that no "gate orphan" is observed. Having addressed the "input completeness" and "gate orphan" issues, the buffer cell can thus achieve robust data synchronization (see references [6] and [7]). Further, the buffer cell in FIG. 5 has a forward latency of two transitions, i.e. a first transition to dis-charge either S.T or S.F to '0', and a corresponding second transition to charge either Q. T or Q.F to '1'.

Although PCHB circuits (or cells) are more advantageous than DIMS, NCL, PSCL circuits (or cells) as they are designed to implement the Integrated-Latch pipeline structure, the PCHB cells tend to suffer from large circuit and power overheads. There are other approaches such as the PS0, LP2/1, Single-Track Asynchronous Pulse Logic (STAPL), Single-Track Full Buffer (STFB) and Sense-Amplifier Pass Transistor Logic (SAPTL) approaches that are also applicable to the Integrated-Latch pipeline structure. However, these approaches are not fully QDI as they require further timing assumptions on top of the "isochronic forks" assumption. This is because the circuit realization of these approaches does not fully address the "input completeness" and/or "gate orphan" issues, hence the circuits require some further timing assumptions to achieve conditional error-free operations. Therefore, circuits based on these approaches are not as operationally robust as those based on fully QDI approaches. Further, similar to the PCHB circuit, the circuits for the PS0, LP2/1, STAPL, STFB and SAPTL approaches also have large circuit overheads. More details of the asynchronous-logic Integrated-Latch pipeline structure and the associated QDI realizations can be found in references [2], [4], [7] and [17]-[19].

In view of the above, it can be said that even though the asynchronous-logic approach is in some ways more advantageous than the synchronous-logic approach, the asynchronous-logic approach still suffers from many problems. For example, QDI digital circuits, such as the PCHB circuit, still suffer from high power dissipation (partly due to the dual-rail encoding) and large IC area requirements. Therefore, similar to current design techniques based on the synchronous-logic approach, current design techniques based on the asynchronous-logic approaches, including the QDI approach, are also unsatisfactory in achieving operations which have simultaneously operational robustness, high-speed, low power dissipation and low EMI attributes.

SUMMARY OF THE INVENTION

The present invention aims to provide a new and useful digital cell for performing a logic operation on a logic input to produce a logic output.

In general terms, the present invention proposes a digital cell comprising two blocks, both blocks configured to detect a valid logic input and further configured to cooperate to produce the logic output upon the detection of the valid logic input. One of these is an evaluation block which generates an output signal when a logic input is valid, and the other is a sense-amplifier which amplifies the output signal to such an extent that it can be recognized (e.g. by other cells) as encoding valid output data.

Specifically, an aspect of the present invention is a digital cell for performing a logic operation on a logic input to produce a logic output, wherein the digital cell comprises an evaluation block and a sense-amplifier block, the evaluation block and the sense amplifier block being configured to together generate output signals representative of the logic output, the logic input comprising at least one bit of data, the logic output comprising at least one bit of data, both the evaluation block and the sense-amplifier block being configured to receive input signals representative of the logic input, and to detect when either said logic input or said input signals encode said at least one bit of data of the logic input such that the at least one bit of data of the logic input is valid or empty, and wherein the digital cell is configured to alternate between a reset state and an evaluate state, such that:

(i) upon the digital cell being in the reset state, and when either said logic input or said input signals encode said at least one bit of data of the logic input such that the at least one bit of data of the logic input is valid, the digital cell is switched from the reset state to the evaluate state in which the evaluation block generates a difference in the output signals based on the logic input and the logic operation to be performed, and the sense-amplifier block amplifies said difference in the output signals so that the output signals encode said at least one bit of data of the logic output, thereby producing valid output signals where the at least one bit of data of the logic output is valid; and (ii) upon the digital cell being in the evaluate state with the valid output signals, when either said logic input or said input signals encode said at least one bit of data of the logic input such that the at least one bit of data of the logic input is empty, the digital cell is triggered to switch from the evaluate state to the reset state.

BRIEF DESCRIPTION OF THE FIGURES

Embodiments of the invention will now be illustrated for the sake of example only with reference to the following drawings, in which.

DETAILED DESCRIPTION OF THE EMBODIMENTS

SAQDI Cell 600

Figure 6:
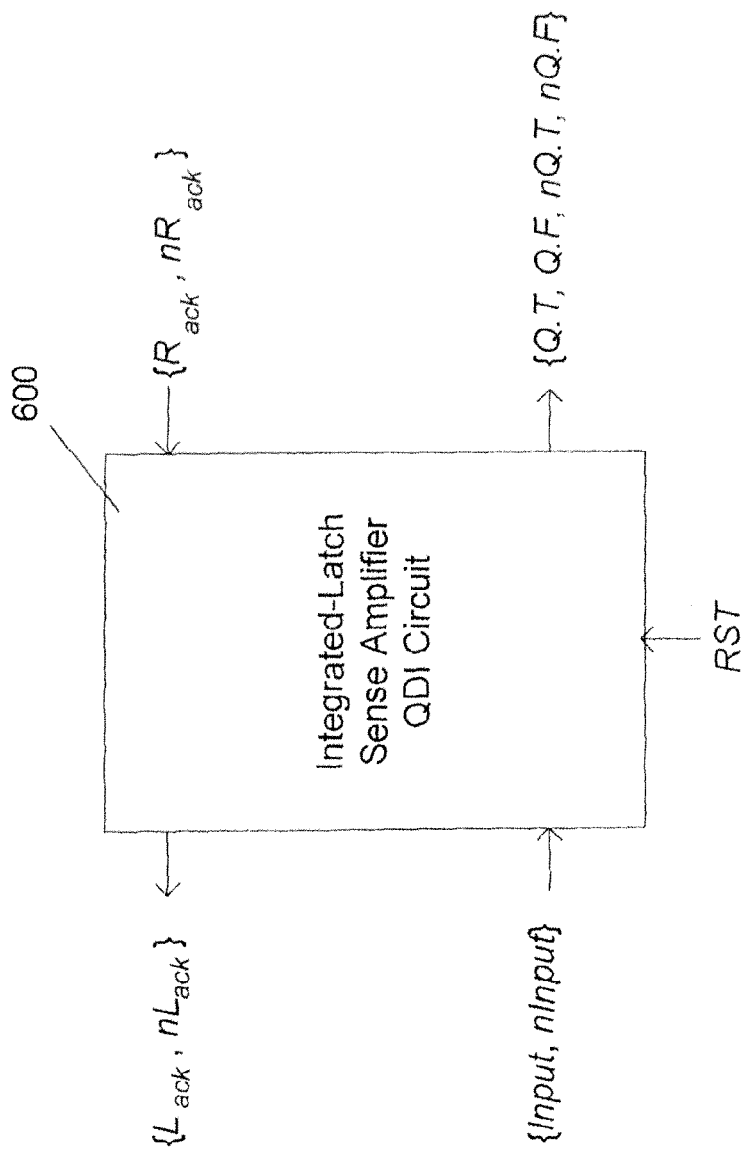
FIG. 6 shows a digital cell for performing a logic operation according to an embodiment of the present invention.

FIG. 6 shows a digital cell 600 for performing a logic operation according to an embodiment of the present invention. In particular, the digital cell 600 is based on the QDI asynchronous-logic approach (i.e. it is a digital QDI cell) and may be referred to as an "Integrated-Latch Sense Amplifier QDI (SAQDI) Circuit" or more simply, a "SAQDI cell".

As shown in FIG. 6, the SAQDI cell 600 is configured to receive input signals representative of a logic input. This logic input comprises a primary logic input, Input and complementary logic input, nInput (note that throughout this document the prefix n is used to denote the logical complement). Note that each of Input and nInput comprises one or more bits. Each bit is encoded by a respective pair of the input signals using the dual rail system. Thus, in the case that the Input is just a single bit, the primary logic input, Input is represented (or encoded) by dual-rail primary input signals A.T, A.F, and the complementary logic input nInput is represented by dual-rail complementary input signals nA.T, nA.F. The SAQDI cell 600 generates output signals representative of a logic output comprising a primary logic output, Q and a complementary logic output, nQ. The primary logic output Q is represented by dual-rail primary output signals Q.T, Q.F and the complementary logic output nQ is represented by dual-rail complementary output signals nQ.T, nQ.F.

The SAQDI cell 600 is further configured to receive an input handshake signal (comprising primary right-channel handshake signal $R_{ack}$ and complementary right-channel handshake signal $nR_{ack}$), and provide an output handshake signal (comprising primary left-channel handshake signal $L_{ack}$ and complementary left-channel handshake signal $nL_{ack}$). An initialization input signal RST is also provided to the SAQDI cell 600.

Figure 7:
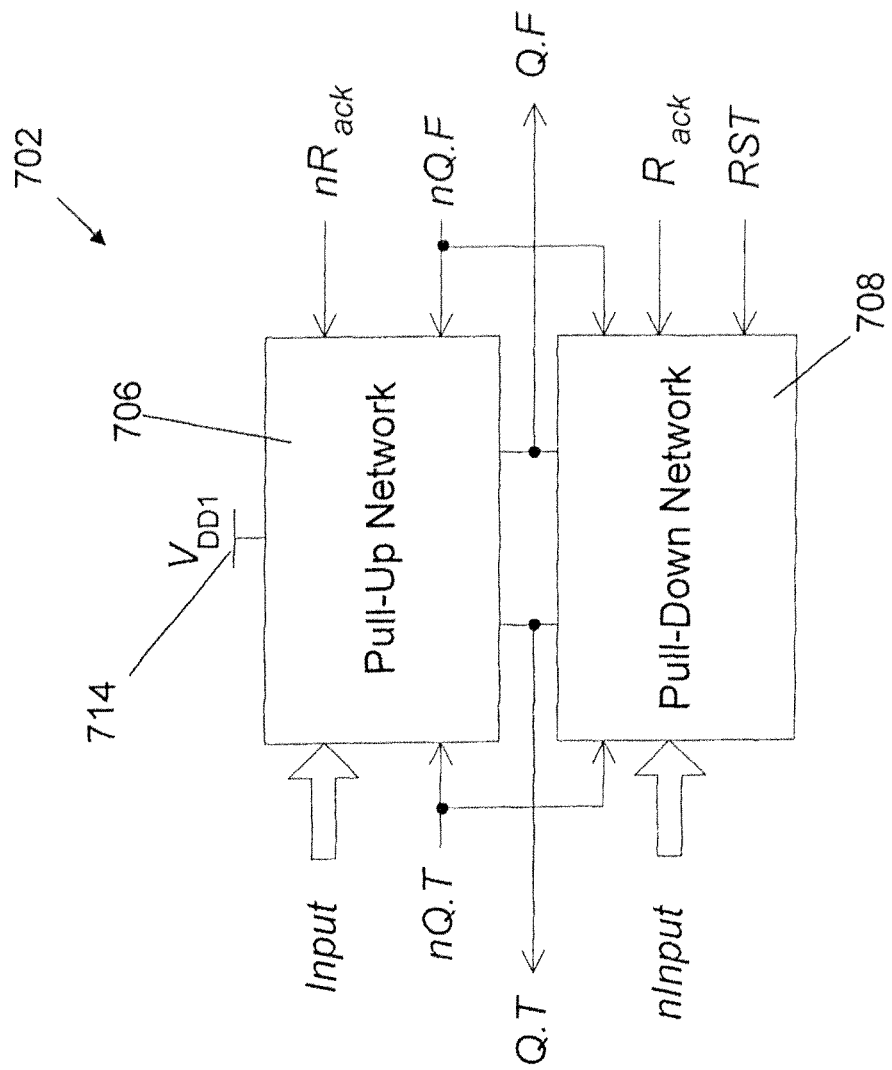
FIGS. 7(a)-(b) show components of the digital cell of FIG. 6.
Figure 7:
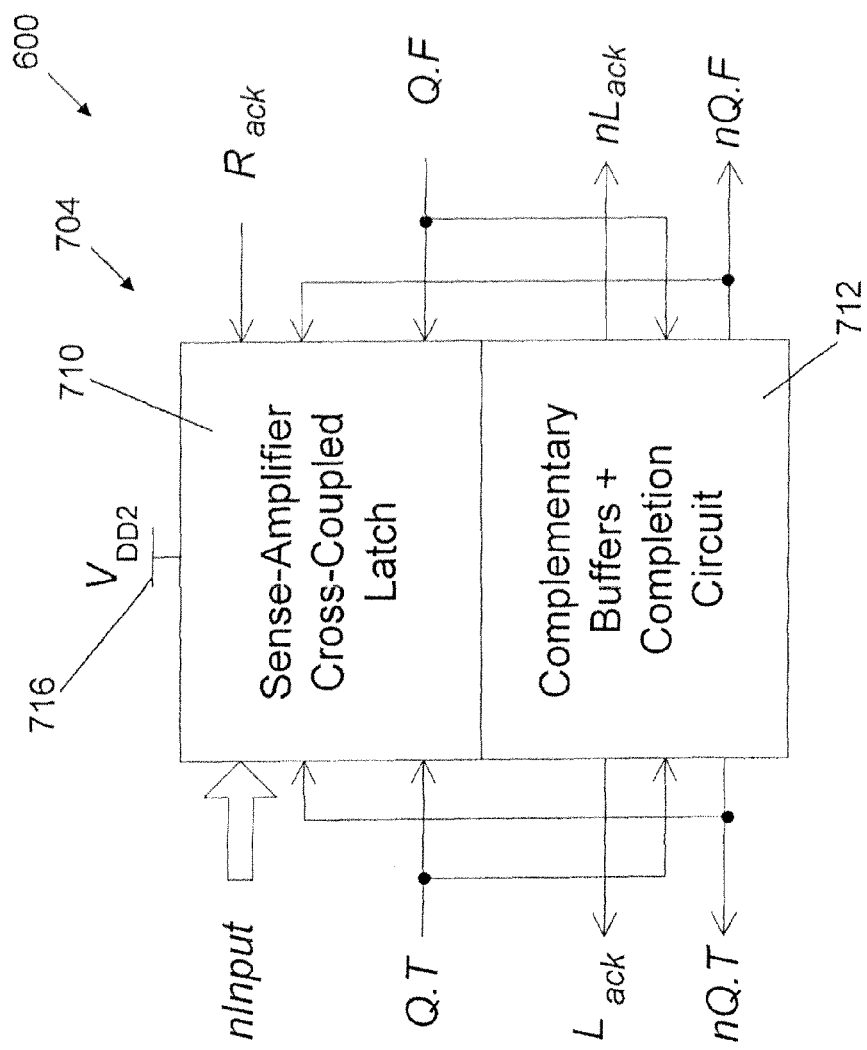

FIGS. 7(a)-(b) show the components of the SAQDI cell 600. In particular, the SAQDI cell 600 comprises an evaluation block 702 as shown in FIG. 7(a) and a sense-amplifier block 704 as shown in FIG. 7(b). The evaluation block 702 comprises a pull-up network 706 and a pull-down network 708. The pull-down network 708 in turn includes a reset circuit (not shown in FIG. 7(a)). The sense-amplifier block 704 comprises an amplification circuit in the form of a sense-amplifier cross-coupled latch 710, complementary buffers and a completion circuit. In FIG. 7(b), the complementary buffers and completion circuit are shown together as block 712. The evaluation and sense-amplifier blocks 702, 704 are configured such that they can either be powered by separate power supplies or by the same power supply. In FIGS. 7(a)-(b), these blocks 702, 704 are shown to be powered by separate power supplies. In particular, as shown in FIG. 7(a), the block 702 is powered by a first supply voltage $V_{DD1}$ at an input 714, and as shown in FIG. 7(b), the block 704 is powered by a second supply voltage $V_{DD2}$ at an input 716. Note that for the SAQDI cell 600 to operate, the voltage $V_{DD2}$ at input 716 supplied to the sense-amplifier block 704 must be equal to or higher than the voltage $V_{DD1}$ at input 714 supplied to the evaluation block 702.

Operation of the SAQDI Cell 600

Similar to other digital QDI cells, the SAQDI cell 600 is configured to operate either in an initialization mode or in an active mode, and in the active mode, is further configured to alternate between a reset state and an evaluate state in the manner as described in the section "Operation of a QDI circuit" above.

In particular, the reset circuit in the pull-down network 708 is configured to receive the initialization input signal RST. This initialization input signal RST serves as the global reset such that when RST is asserted (i.e. RST becomes at logic '1'), the reset circuit is activated, and the SAQDI cell 600 is reset and enters the initialization mode. The initialization input signal RST should be negated (i.e. RST should be at logic '0') for the SAQDI cell 600 to enter the active mode.

When the SAQDI cell 600 is in the initialization mode, the logic input (Input and its complement nInput) and output (Q and its complement nQ) are empty i.e. both the input signals and output signals do not encode any valid bit, and the input and output handshake signals are negated. Thus, in the case that the Input comprises just one bit, the primary input, output and handshake signals A.T, A.F, Q.T, Q.F, $L_{ack}$, $R_{ack}$ are all at logic '0', whereas the complements nA.T, nA.F, nQ.T, nQ.F, $nL_{ack}$, $nR_{ack}$ are all at logic '1'. When the initialization input signal RST is negated, the SAQDI cell 600 enters the active mode with its input, output and handshake signals remaining at the same logic states i.e. the cell 600 enters the reset state of the active mode.

The evaluation block 702 and the sense-amplifier block 704 are both configured to receive the input signals representative of the logic input and to detect when the input signals validly encode at least one bit of Input or in other words, detect a valid logic input (i.e. in the case that Input comprises just one bit, either A.T at logic '1' and nA.T at logic '0' with A.F at logic '0' and nA.F at logic '1', or A.T at logic '0' and nA.T at logic '1' with A.F at logic '1' and nA.F at logic '0'). Upon the detection of a valid logic input (and with $R_{ack}$ at logic '0'), the cell 600 is switched from the reset state to the evaluate state.

In the evaluate state, the SAQDI cell 600 first performs the evaluation operation. This evaluation operation involves generating the logic output Q, nQ In particular, upon detection of a valid logic input, the evaluation block 702 generates a difference in its output signals Q.T, Q.F based on the logic input and the logic operation to be performed. This is done via the cooperation of its pull-up and pull-down networks 706, 708.

Also upon detection of a valid logic input, the sense-amplifier cross-coupled latch 710 turns on and amplifies (with a positive feedback mechanism) the difference in the output signals Q.T, Q.F generated by the evaluation block 702, to increase the value of the higher of those signals to a value suitable for transmission to other cells. This produces primary output signals Q.T, Q.F which encode a valid bit, thus generating a valid primary logic output Q. These output signals Q.T, Q.F are then latched by the sense-amplifier cross-coupled latch 710. The complementary buffers generate the complementary output signals nQ.T, nQ.F from the primary output signals Q.T, Q.F (hence, producing a valid complementary logic output nQ), and the completion circuit detects the valid logic output Q, nQ and asserts the output handshake signal (i.e. changing $L_{ack}$ to logic '1' and $nL_{ack}$ to logic '0') to indicate the validity of the logic output Q, nQ.

The SAQDI cell 600 only performs the reset operation to return to the reset state when the logic input become empty again and if the input handshake signal becomes asserted (i.e. if $R_{ack}$ becomes at logic '1' and $nR_{ack}$ becomes at logic '0'). The reset operation involves (i) resetting the logic output i.e. causing the logic output to become empty and (ii) negating the output handshake signal (i.e. changing $L_{ack}$ to logic '0' and $nL_{ack}$ to logic '1'). In particular, the logic output Q, nQ is reset via the pull-down network 708 whereas the output handshake signal (comprising $L_{ack}$, $nL_{ack}$) is negated via the completion circuit. When the input handshake signal (comprising $R_{ack}$, $nR_{ack}$) is again negated (i.e. $R_{ack}$ becomes at logic '0', $nR_{ack}$ becomes at logic '1'), the SAQDI cell 600 returns to the reset state and is ready for the next evaluation operation.

Realizations of the SAQDI Cell 600

Figure 8:
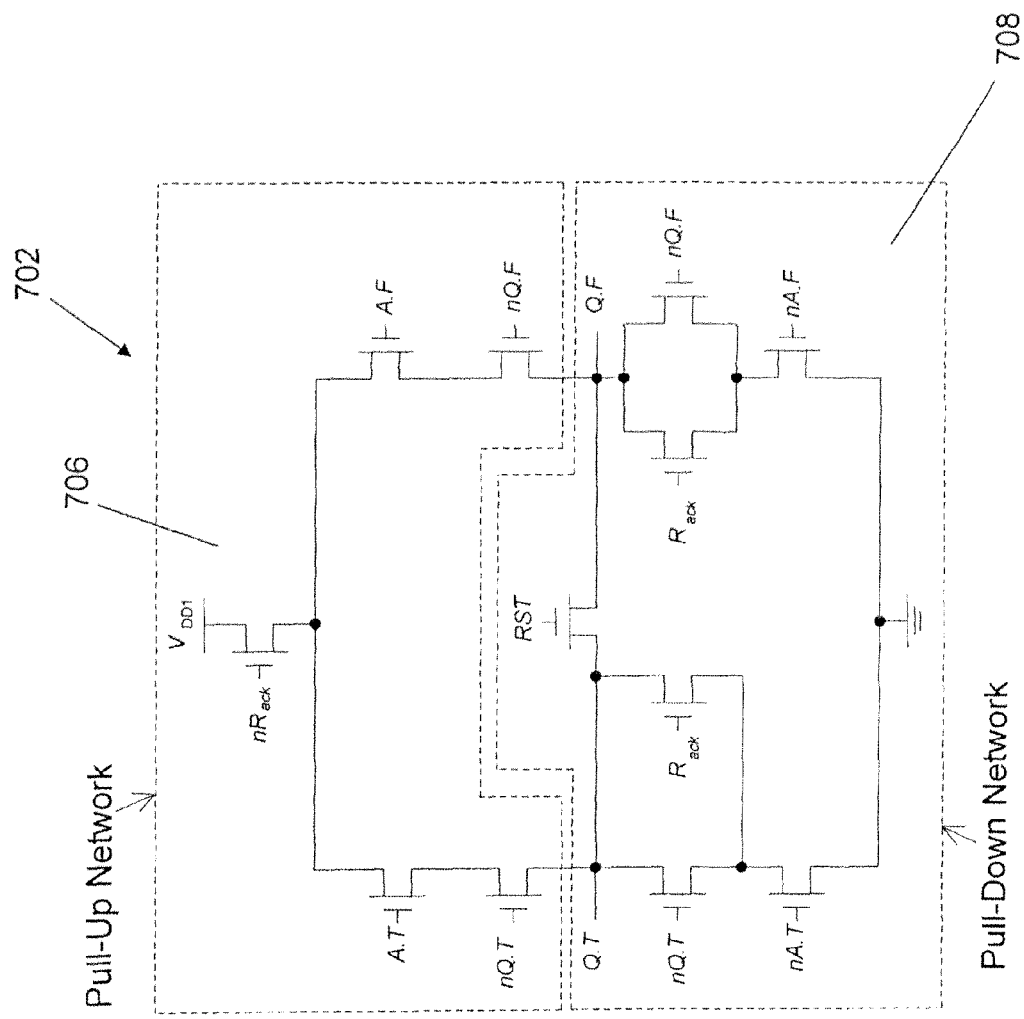
FIGS. 8(a)-(b) show a buffer cell based on the digital cell of FIG. 6.
Figure 8:
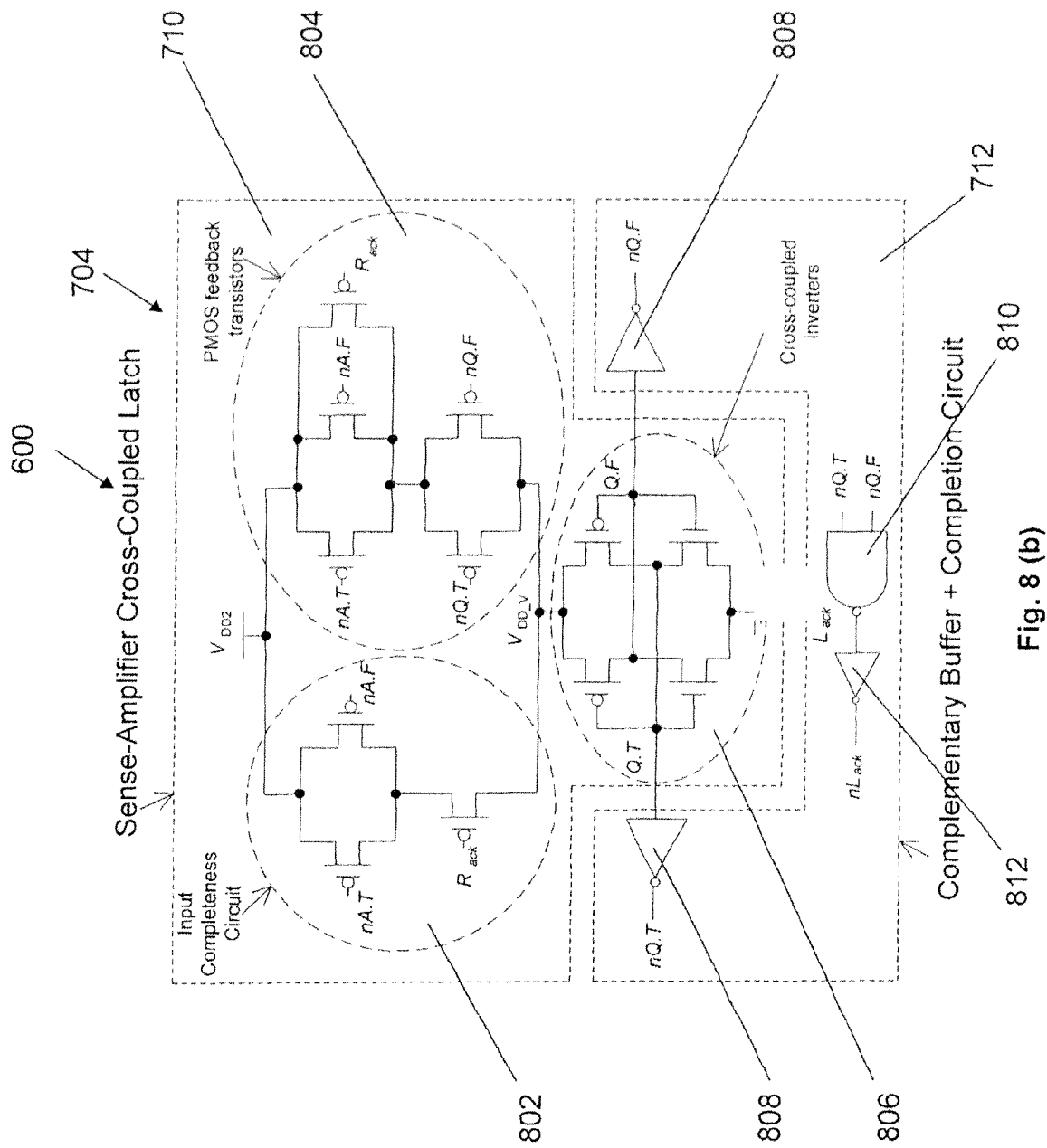

FIGS. 8(a)-(b) show an example realization of the SAQDI cell 600 in the case that Input comprises just one bit. In particular, FIGS. 8(a)-(b) show a QDI buffer cell implemented based on the SAQDI cell 600, with FIG. 8(a) showing the evaluation block 702 and FIG. 8(b) showing the sense-amplifier block 704.

As shown in FIG. 8(a), the pull-up and pull-down networks 706, 708 in the evaluation block 702 comprise a plurality of NMOS transistors. In particular, one of the NMOS transistors in the pull-down network 708 is configured to receive the initialization input signal RST. If this initialization input signal RST is asserted, the NMOS transistor turns on, thus shorting the output signals Q.T, Q.F together, resetting these output signals Q.T, Q.F. This resets the logic output Q, nQ.

As shown in FIG. 8(b), the sense-amplifier cross-coupled latch 710 comprises an input completeness circuit 802 and a feedback circuit 804, each of which comprises a plurality of PMOS transistors. The sense-amplifier cross-coupled latch 710 also comprises a holding circuit 806 which in turn comprises cross-coupled inverters formed of a mixture of PMOS and NMOS transistors. The complementary buffers comprise two inverters 808 configured to receive the primary output signals Q.T, Q.F and provide the complementary output signals nQ.T, nQ.F. The completion circuit comprises an NAND gate 810 configured to receive the complementary output signals nQ.T, nQ.F and provide the primary left-channel handshake signal $L_{ack}$. The completion circuit further comprises an inverter 812 for providing the complementary left-channel handshake signal $nL_{ack}$.

An example operation of the QDI buffer cell is described below.

When the QDI buffer cell is in the initialization mode (only once) or in the reset state of the active mode, the logic input and output are all empty and the handshake signals are all negated. In other words, A.T, A.F, Q.T, Q.F, $L_{ack}$, $R_{ack}$ are all at logic '0', whereas the complements nA.T, nA.F, nQ.T, nQ.F, $nL_{ack}$, $nR_{ack}$ are all at logic '1'.

When the QDI buffer is in the active mode and when it receives a valid logic input with A.F at logic '1' (nA.F at logic '0') and A.T at logic '0' (nA.T at logic '1'), it enters the evaluate state of the active mode and first performs the evaluation operation as follows.

Since A.F is at logic '1' and A.T is at logic '0' whereas nA.F is at logic '0' and nA.T is at logic '1', the output signal Q.F of the evaluation block 702 gets partially charged up by the pull-up network 706 whereas the output signal Q.T remains grounded via the pull-down network 708. A voltage difference in the output signals Q.T, Q.F is thus generated.

The valid logic input is also received by the sense-amplifier block 704. As nA.F is now at logic '0' (and $R_{ack}$ remains at logic '0'), the input completeness circuit 802 turns on, shorting the virtual supply voltage $V_{DD\_v}$ to the supply voltage $V_{DD2}$. This raises the virtual supply voltage $V_{DD\_v}$ from a voltage of about $V_{tp}$ to $V_{DD2}$, turning on the holding circuit 806 and further charging up the output signal Q.F. This hence amplifies the voltage of the output signal Q.F (in other words, amplifies the voltage difference in the output signals Q.T, Q.F) to a level at which the output signal Q.F can be considered to be at logic '1'. As mentioned above, the output signal Q.T remains grounded via the pull-down network 708 and is hence at logic '0'. Therefore, a valid primary logic output with Q.T at logic '0' and Q.F at logic '1' are produced. A valid complementary logic output with nQ.T at logic '1' and nQ.F at logic '0' are then obtained through the inverters 808.

The output signals Q.T, Q.F, nQ.T, nQ.F representing the valid logic output Q, nQ are then latched via the cross-coupled inverters in the holding circuit 806. For the cross-coupled inverters to maintain this state-latching function, the holding circuit 806 has to be kept on. This is achieved via the feedback circuit 804 which is configured to keep the holding circuit 806 on if the logic output Q, nQ is valid. More specifically, the feedback circuit 804 is configured to receive the complementary output signals nQ.T, nQ.F. Since nQ.F is now at logic '0', the feedback circuit 804 turns on, thus maintaining the virtual supply voltage $V_{DD\_v}$ at $V_{DD2}$ and keeping the holding circuit 806 on even if the input completeness circuit 802 turns off due to for example, a change in the logic state of nA.F, or an assertion of $R_{ack}$ from logic '0' to logic '1' (if both nA.F and $R_{ack}$ become at logic '1', the reset operation will start as will be described in more detail later on). The complementary output signal nQ.F is also fed back to the evaluation block 702. Since nQ.F is at logic '0', when the pull-up network 706 receives this complementary output signal nQ.F, it disconnects the output signal Q.F from the supply voltage $V_{DD1}$. This prevents short-circuit current to the output signal Q.F. Note that this disconnecting of the output signal Q.F from the supply voltage $V_{DD1}$ is only necessary in this case as the evaluation block 702 and the sense-amplifier block 704 are powered by separate power supplies $V_{DD1}$, $V_{DD2}$ as shown in FIGS. 8(a) and (b). If the evaluation and sense-amplifier blocks 702, 704 are powered by the same power supply, there is no need to disconnect the output signal Q.F from the supply voltage as any short-circuit current to the output signal Q.F will be negligible. Therefore, in this latter case, the transistors receiving the complementary output signals nQ.T, nQ.F in the pull-up network 706 need not be present.

The output signals nQ.T, nQ.F are also provided to the NAND gate 810 in the completion circuit. Since nQ.T is at logic '1' and nQ.F is at logic '0', the primary left-channel handshake signal $L_{ack}$ becomes at logic '1' whereas the complementary left-channel handshake signal $nL_{ack}$ provided through the inverter 812 becomes at logic '0'. In other words, the input handshake signal becomes asserted.

When the logic input becomes empty again (i.e. A.F returns to logic '0' and nA.F returns to logic '1') and the output handshake signal becomes asserted (i.e. $R_{ack}$ becomes at logic '1' and $nR_{ack}$ becomes at logic '0'), the QDI buffer cell performs the reset operation to return to the reset state as follows.

Since nA.T, nA.F and $R_{ack}$ are now all at logic '1', the feedback circuit 804 of the sense-amplifier cross-coupled latch 710 turns off. Thus, the virtual supply voltage $V_{DD\_v}$ is no longer held at the supply voltage $V_{DD2}$ and the holding circuit 806 is no longer kept on to perform its state-latching function. Furthermore, upon receiving the empty logic input (with nA.T and nA.F both at logic '1') and the asserted output handshake signal (with $R_{ack}$ at logic '1'), the pull-down network 708 turns on. This shorts the output signals Q.T, Q.F to ground, hence resetting the output signals Q.T, Q.F to logic '0' (i.e. the logic output Q, nQ is reset and become empty). This resetting of the output signals Q.T, Q.F negates the output handshake signal. Specifically, the primary left-channel handshake signal $L_{ack}$ becomes at logic '0' via the NAND gate 810 and the complementary left-channel handshake signal $nL_{ack}$ becomes at logic '1' via the inverter 812 in the completion circuit.

Figure 9:
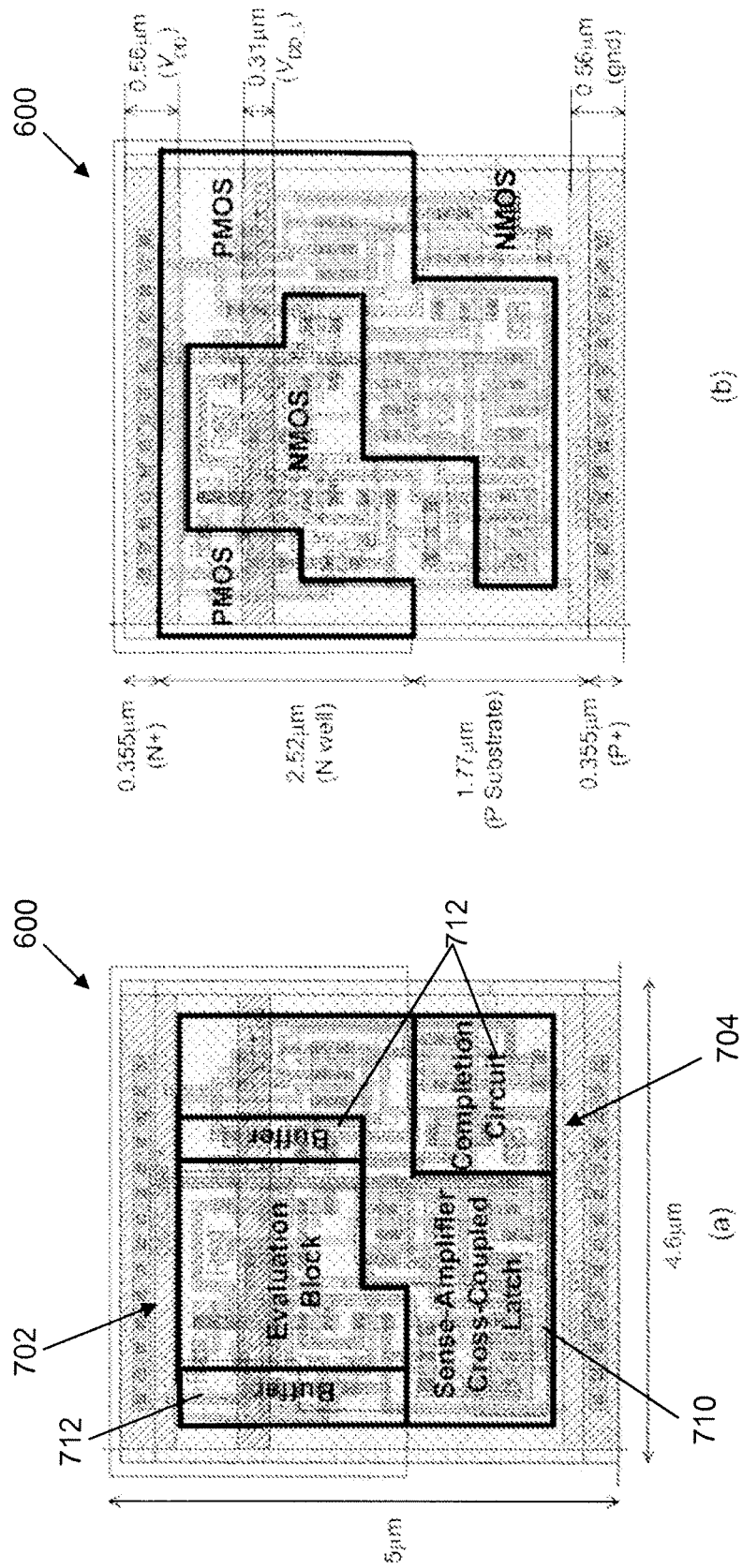
FIGS. 9(a)-(b) show a layout realization of the buffer cell of FIGS. 8(a)-(b), with FIG. 9(a) highlighting the different sub-blocks of the buffer cell and FIG. 9(b) highlighting the different transistor types in the buffer cell.

The layout realization of the QDI buffer cell shown in FIGS. 8(a)-(b) may be achieved using standard library cell practice. In particular, FIGS. 9(a)-(b) show an example layout realization of the QDI buffer cell, with FIG. 9(a) highlighting the different sub-blocks of the cell and FIG. 9(b) highlighting the PMOS and NMOS transistors in the cell. With this layout realization shown in FIGS. 9(a)-(b), the QDI buffer cell has a total area of 5 μm×4.6 μm based on a 65 nm CMOS technology. The efficacy of the QDI buffer cell can be verified by means of computer simulations based on commercial fabrication processes. Using the layout realization shown in FIGS. 9(a)-(b) and post-layout extraction, figures-of-merit including power dissipation, delay, power-delay product and IC area requirements of the QDI buffer cell can be obtained.

Other types of QDI cells can also be realized based on the SAQDI cell 600. In many of these, the logic input, Input, comprises more than one bit (k bits, k>1). For example, FIGS. 10(a)-(b) respectively show a 2-input AND/NAND cell (with Input comprising a first bit represented by input signals A.T, A.F and a second bit represented by input signals B.T, B.F) and a 3-input AO/AOI cell (with Input comprising a first bit represented by input signals A.T, A.F, a second bit represented by input signals B.T, B.F and a third bit represented by input signals C.T, C.F), both of which are based on the SAQDI cell 600. In particular, FIGS. 10(a)-(b) each shows (on the left) the evaluation block 702 of the cell having the pull-up network 706 and the pull-down network 708, and (on the right) the sense-amplifier block 704 of the cell having the sense-amplifier cross-coupled latch 710 and the block 712 comprising the complementary buffers and the completion circuit.

Figure 10:
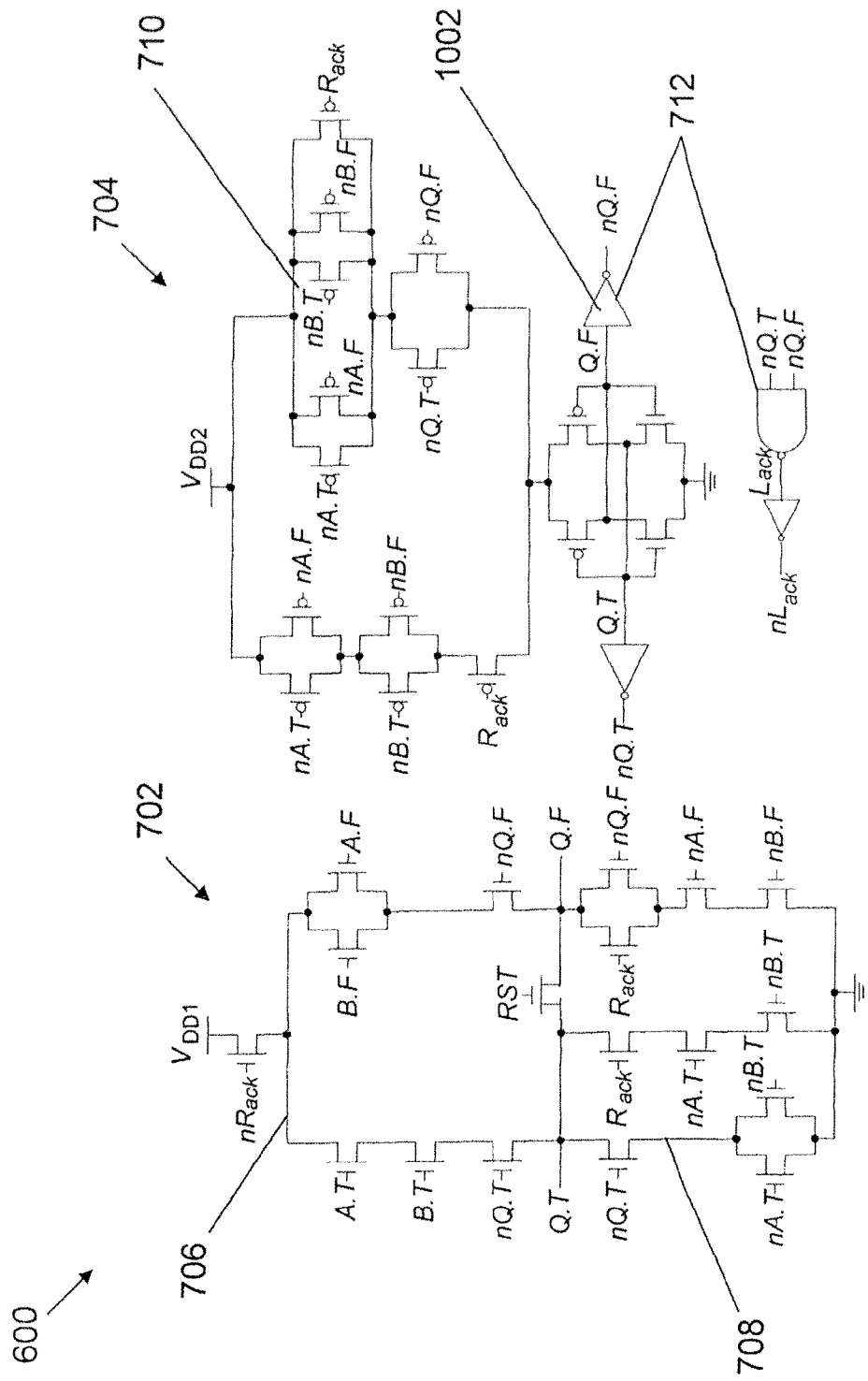
FIGS. 10(a)-(b) respectively show a 2-input AND/NAND cell and a 3-input AO/AOI cell, both of which are examples of the digital cell of FIG. 6.
Figure 10:
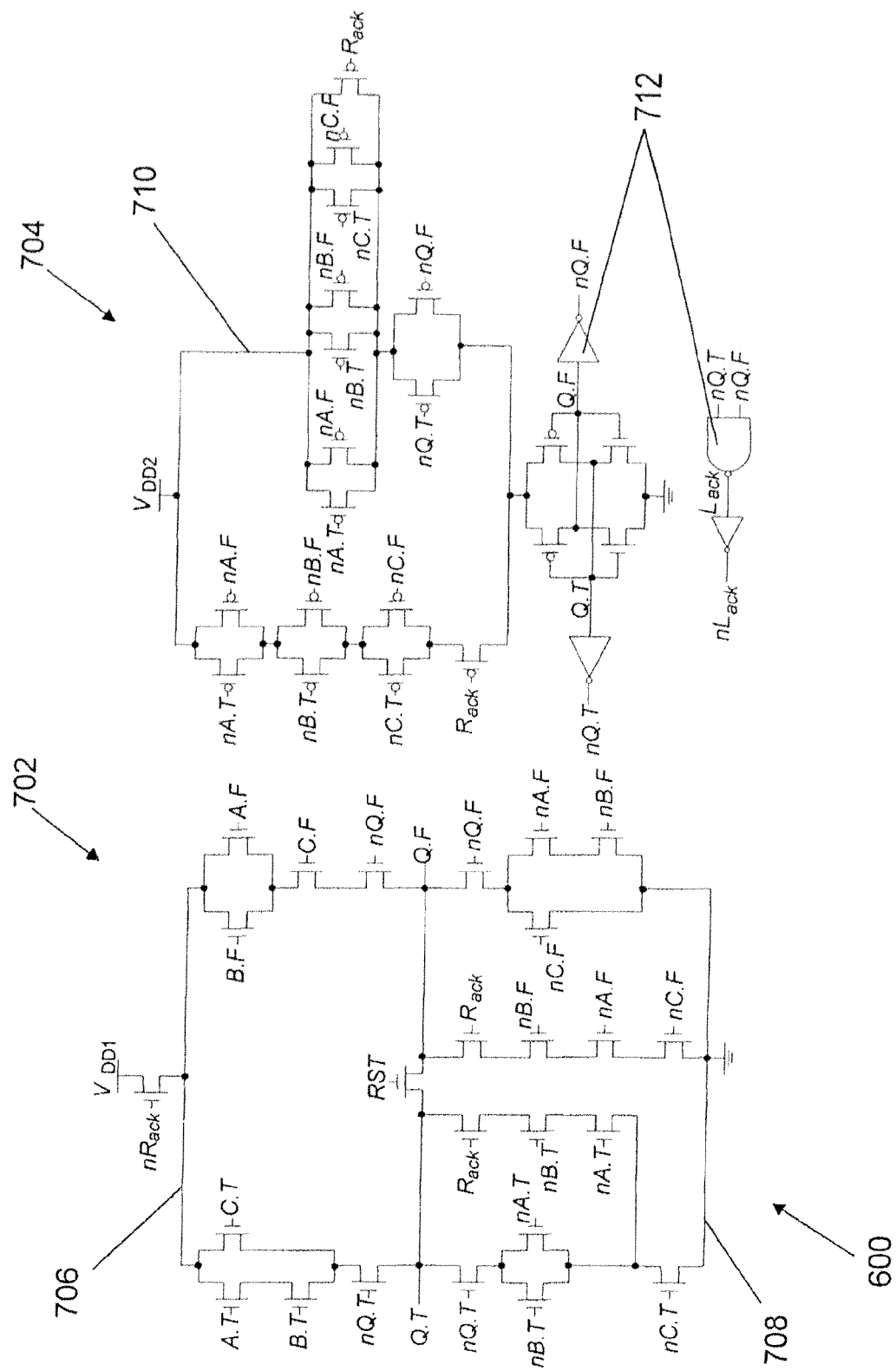

In FIGS. 10(a) and (b), the transistor configuration in the pull-up network 706 within the evaluation block 702 is designed to possibly feature an early computation. This means that the evaluation block 702 may start evaluating (i.e. start generating voltage difference(s) in its output signals) even when only some of the bits of the logic input are valid i.e. it does not need to wait until all the bits of the logic input become valid. For example, in FIG. 10(a), when A.F='1' (nA.F='0') and nQ.F='1' (independent of B.F), Q.F will be partially charged. In this case, to prevent the partially charged Q.F to erroneously initiate the computation (this will violate the "input completeness" issue), the supply voltage $V_{DD1}$ needs to be set smaller than the switching threshold voltage of the buffer 1002 within the sense-amplifier block 704, so that even with the partially charged Q.F, valid output signals are not produced. For example, $V_{DD1}$ can be set at the sub-threshold voltage region, e.g. 0.3V. The low $V_{DD1}$ also helps in reducing the dynamic and leakage power in the evaluation block 702.

However, should it be desired that $V_{DD1}$ and $V_{DD2}$ be set the same, the pull-up network 706 within the evaluation block 702 needs to designed such that the evaluation block 702 will only start evaluating when all the bits of the logic input are valid.

Note that the SAQDI cell 600 may be realized using circuits different from those shown in FIGS. 8(a)-(b) and FIGS. 10(a)-(b). For example, different types of transistors may be used (i.e. the NMOS transistors may be replaced by PMOS transistors or vice versa) with according changes in the logic states of the different signals. Some of the transistors may be removed or more transistors may be added. Also, the components of the SAQDI cell 600 need not be fully implemented using transistors. One or more of these components may be fully or partially implemented using other types of devices having a switch function.

Pipelines Comprising the SAQDI Cell 600

The SAQDI cell 600 is designed such that it can be adopted in the Integrated-Latch pipeline structure (although, if desired, the SAQDI cell 600 can also be adopted in the Data-Control-Decomposition pipeline structure).

FIGS. 11(a)-(d) illustrates how the SAQDI cell 600 may be adopted in the Integrated-Latch pipeline structure.

Figure 11:
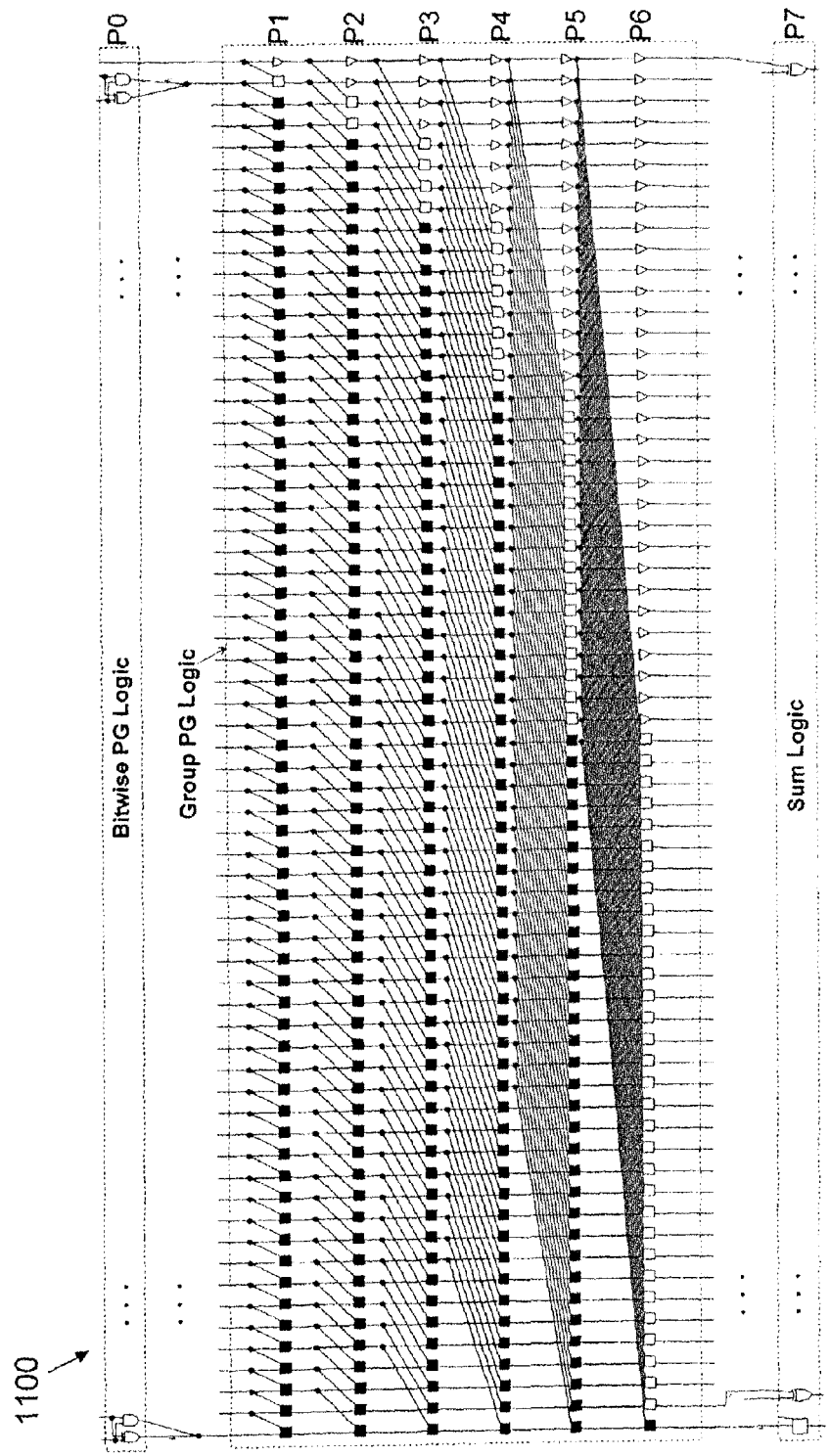
FIG. 11(a) shows a pipeline adder comprising the digital cell of FIG. 6, and FIGS. 11(b)-(d) show the different types of pipeline blocks in the pipeline adder of FIG. 11(a)
Figure 11:
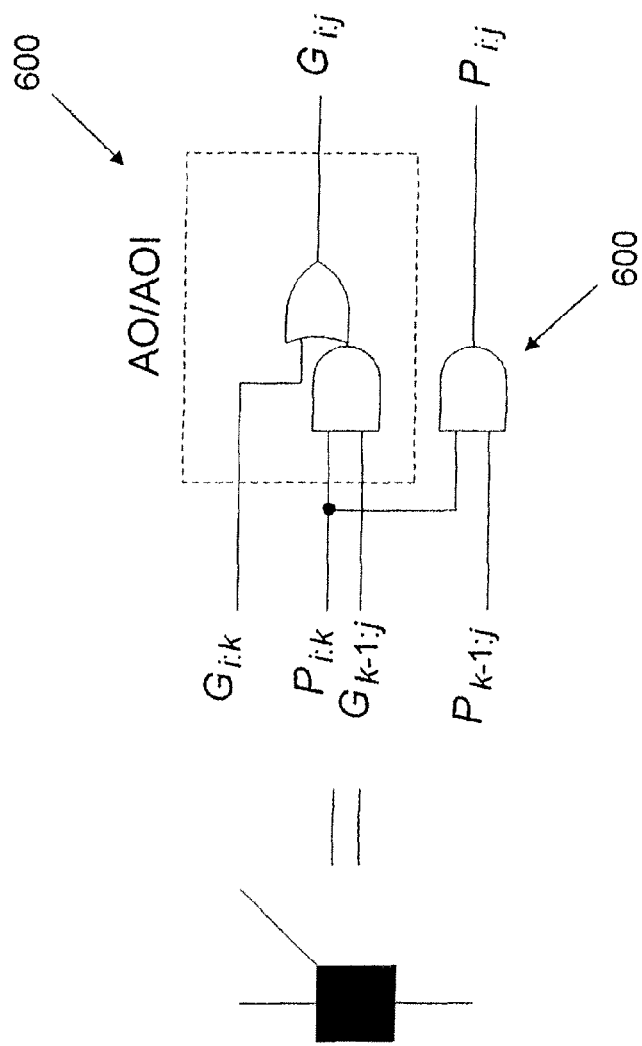
Figure 11:
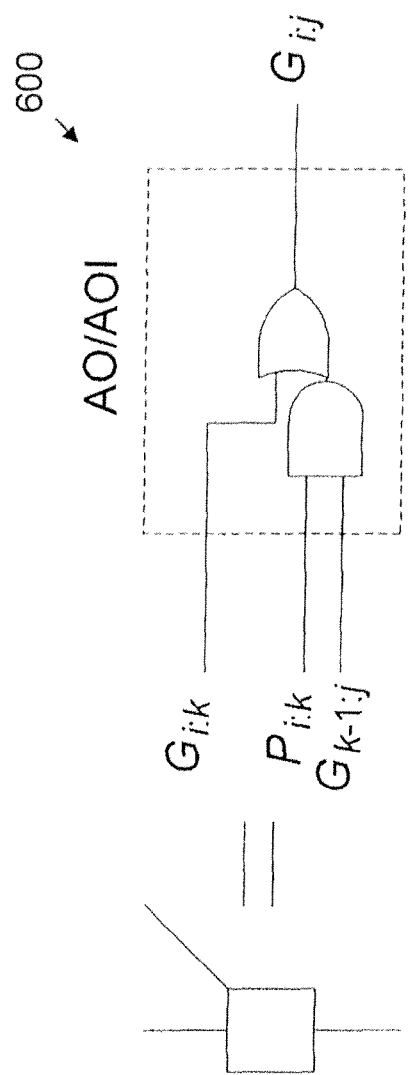
Figure 11:
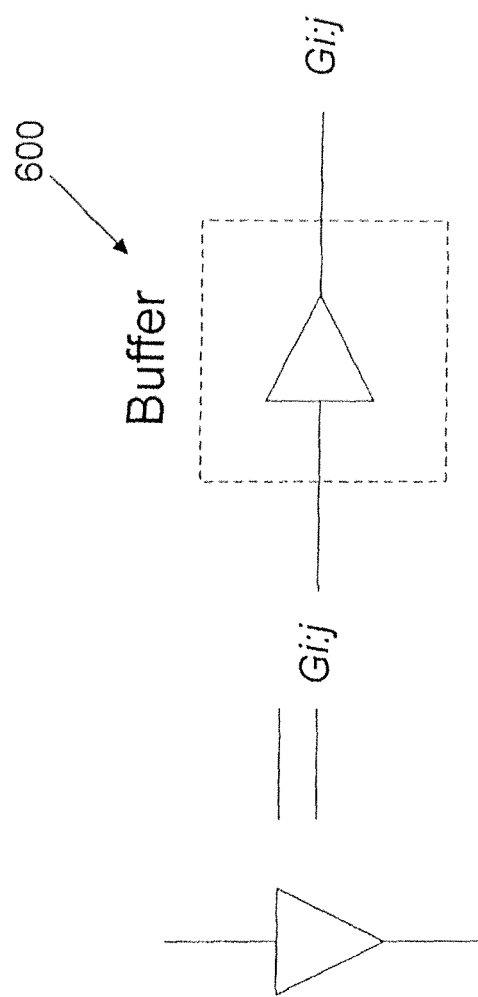

In particular, FIG. 11(a) shows a block diagram of a 64-bit Kogge-Stone pipeline adder 1100 comprising QDI cells implemented based on the SAQDI cell 600. The primary inputs to the pipeline adder 1100 are $A=A_{63} \ldots A_0$, $B=B_{63} \ldots B_0$ and the Carry-in input $C_{in}$. The primary outputs of the adder 1100 are $S=S_{63} \ldots S_0$ and the Carry-out output $C_{out}$. The pipeline adder 1100 operates using asynchronous-logic handshake signals (not shown in FIG. 11).

The pipeline adder 1100 is constructed in the form of a multiple carry look-ahead tree so as to shorten the carry propagation time and in turn, increase the speed of the pipeline adder 1100. In particular, the pipeline adder 1100 comprises a total of eight pipeline stages, resulting in a (forward) latency of eight pipeline delays and a throughput rate of an inverse of one pipeline cycle-time delay. The first pipeline stage (Pipeline 0) forms the Bitwise Propagate-Generate (PG) Logic, the next six pipeline stages (Pipelines 1-6) form the Group PG Logic, and the last pipeline stage (Pipeline 7) forms the Sum Logic of the pipeline adder 1100.

The pipeline adder 1100 comprises a plurality of pipeline blocks arranged successively. There are three different types of pipeline blocks in the adder 1100. These are shown in FIGS. 11(b)-(d). In particular, the first type of pipeline block shown in FIG. 11(b) comprises an AO/AOI cell and a AND/NAND cell, the second type of pipeline block shown in FIG. 11(c) comprises an AO/AOI cell and the third type of pipeline block shown in FIG. 11(d) comprises a Buffer cell. These cells are implemented based on the SAQDI cell 600. Each pipeline block receives inputs $G_{i:j}$, $P_{i:j}$ from the pipeline block prior to it and provides outputs $\tilde{G}_{i:j}$, $\tilde{P}_{i:j}$ to the pipeline block subsequent to it.

Figure 12:
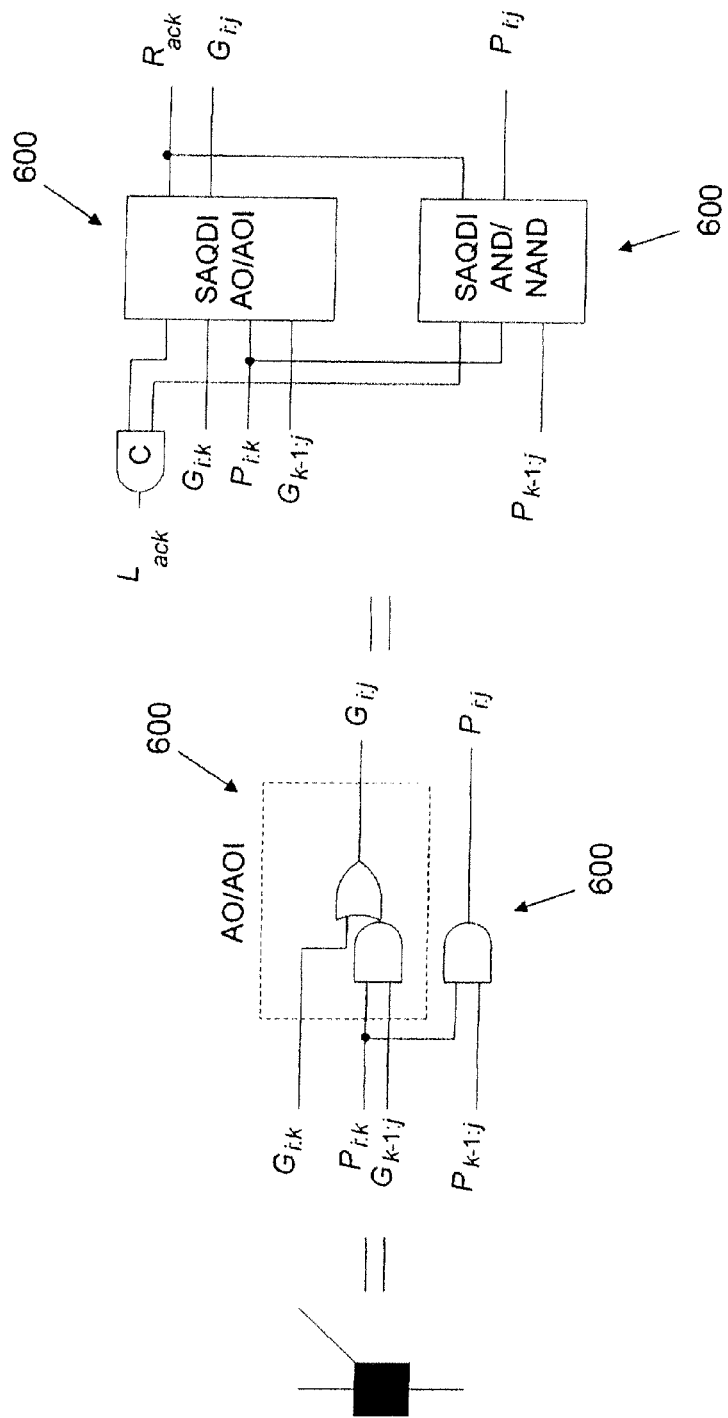
FIG. 12 shows further details of one of the types of pipeline blocks in the pipeline adder of FIG. 11(a)

FIG. 12 shows further details of the first type of pipeline block. As mentioned above, this pipeline block comprises an AO/AOI cell and an AND/NAND cell. These cells are implemented based on the SAQDI cell 600 as more clearly illustrated in the circuit on the right of FIG. 12. In particular, the AO/AOI cell is shown as the "SAQDI AO/AOI" block whereas the AND/NAND cell is shown as the "SAQDI AND/NAND" block.

The handshake protocol for this pipeline block in FIG. 12 is as follows. The pipeline block provides an overall output handshake signal to a pipeline block prior to it (only the primary signal $L_{ack}$ and not its complement is shown in FIG. 12). This overall output handshake signal is provided via a C-Muller cell and is asserted when the output handshake signals of both the AO/AOI and AND/NAND cells are asserted, indicating that both of these cells have generated their logic outputs. Therefore, an assertion of the overall output handshake signal is an indication that the operation on the outputs $G_{i:j}$, $P_{i:j}$ of the previous pipeline block has been completed (or in other words, have been consumed). The overall output handshake signal is negated when the output handshake signals of both the AO/AOI and AND/NAND are negated, indicating that both of these cells have reset their logic outputs. If only one of the cells has generated its logic output or has reset its logic output, the overall output handshake signal will remain unchanged.

The pipeline block in FIG. 12 receives the overall output handshake signal provided by a subsequent pipeline block as its overall input handshake signal (again, only the primary signal $R_{ack}$ and not its complement is shown in FIG. 12). This overall input handshake signal serves as the input handshake signals to both the AO/AOI and AND/NAND cells. Since this overall input handshake signal is in fact the overall output handshake signal of the subsequent pipeline block, the state of this overall input handshake signal is an indication of whether the outputs $\tilde{G}_{i:j}$ and $\tilde{P}_{i:j}$ (of the pipeline block in FIG. 12) have been consumed by the subsequent pipeline block.

The handshake protocol for the second and third type of pipeline blocks is the same as the handshake protocol for the first type of pipeline block as described above.

Besides the pipeline adder 1100, other types of pipelines may be constructed using the SAQDI cell 600. A pipeline may also comprise a SAQDI cell 600 together with other types of cells as long as these other types of cells are able to cooperate with the SAQDI cell 600 to implement the desired handshake protocol. For example, a pipeline block may comprise a SAQDI cell 600 together with a PCHB cell since both of these cells are configured to receive an input handshake signal (comprising $L_{ack}$ and/or $nL_{ack}$) for their operations and provide an output handshake signal (comprising $R_{ack}$ and/or $nR_{ack}$).

Advantages of the SAQDI Cell 600

The SAQDI cell 600 is advantageous as it is robust (virtually insensitive to PVT variations), has a high speed (low delay), low power dissipation, low EMI and low IC area requirements. Due to its operational robustness, the SAQDI cell 600 can be used to achieve more reliable circuit design technologies and is thus particularly useful for implementing current and future electronic devices, especially when PVT variations in circuits fabricated by future nano-scaled fabrication processes are expected to increase. The SAQDI cell 600 is also particularly useful in implementing electronic devices requiring a high speed at a low power budget and low EMI. Due to the low IC area requirements of the SAQDI cell 600, these electronic devices can also be made smaller.

The above advantages are in part due to the use of the QDI asynchronous-logic approach in the SAQDI cell 600. This confers operational robustness on the cell 600 as no timing assumptions, except for the "isochronic forks" assumption which can be fulfilled in practice, are required. Therefore, the SAQDI cell 600 is more robust than cells implemented based on the synchronous-logic approach and those implemented based on asynchronous-logic approaches which require timing assumptions.

Although other QDI cells such as the PCSL cell, NCL cell, DIMS cell are available, the SAQDI cell 600 is advantageous over these other QDI cells as it is designed for application in the Integrated-Latch pipeline structure whereas the PCSL, NCL, DIMS cells are designed for application in the Data-Control Decomposition pipeline structure. As mentioned above, a pipeline based on the Integrated-Latch pipeline structure operates faster than a pipeline based on the Data-Control Decomposition pipeline structure.

The PCHB cell is also designed for application in the Integrated-Latch pipeline structure but its performance is inferior to that of the SAQDI cell 600. In particular, Table III shows comparison results between library cells implemented based on the SAQDI cell 600 and library cells implemented based on the PCHB cell. There are in total six types of library cells, namely the 1-bit buffer, 2-bit AND/NAND cell, 2-bit OR/NOR cell, 2-bit XOR/XNOR cell, 2-bit MUX/IMUX cell and 3-bit AO/AOI cell, used for the comparison. The cells are designed with 65 nm CMOS technology. The supply voltages $V_{DD1}=0.3V$ and $V_{DD2}=1V$ are used for the library cells implemented based on the SAQDI cell 600, and a supply voltage of 1V is used for the library cells implemented based on the PCHB cell. For ease of comparison, the figures-of-merit obtained by the cells based on the PCHB cell are normalized with respect to those obtained by the cells based on the SAQDI cell 600. The actual figures-of-merit obtained by the cells based on the SAQDI cell 600 are shown in parentheses. These figures-of-merit include power dissipation (Power), delay, power-delay product (Power×Delay) and IC area requirements.

600 also have lower IC area requirements. More specifically, on average, the cells based on the PCHB cell dissipate 2.8× more power, are 1.27× slower, have a power-delay product that is 3.58× worse and require 1.06× more IC area than the cells based on the SAQDI cell 600.

A comparison between a 64-bit adder implemented using the SAQDI cell 600 and a 64-bit adder implemented using the PCHB cell is also performed, with both adders having the structure shown in FIG. 11. Through this comparison, it is found that the adder implemented using the SAQDI cell 600 performs better than that implemented using the PCHB cell. In particular, the adder implemented using the PCHB cell dissipates 2× more power, is 1.2× slower and requires a 1.06× larger IC area than the adder implemented using the SAQDI cell 600.

The superior performance of the SAQDI cell 600 is at least in part due to the following reasons.

The SAQDI cell 600 comprises a sense-amplifier block 704 which helps to increase the speed of the cell 600. In particular, as the sense-amplifier block 704 is configured to amplify the difference in the output signals from the evaluation block 702, the evaluation block 702 need only partially charge the output signal (either Q.T or Q.F) by generating a small voltage swing since a full voltage swing can be eventually established through the operation of the sense-amplifier block 704. Because of the cooperation between the evaluation and sense-amplifier blocks 702, 704, the forward latency (from the input to the output of the SAQDI cell 600) comprises only one transition instead of the usual two transitions in prior art QDI cells (including the PCHB cell). This speeds up the operation of the SAQDI cell 600. Furthermore, the amplification process by the sense-amplifier block 704 does not require any timing considerations and hence, is operationally robust.

The sense-amplifier block 704 is also useful in that it addresses the "input-completeness" issue as its input completeness circuit 802 is turned on only when the logic input is valid. In fact, the input completeness circuit 802 serves not only to address the "input completeness issue" but also as part of the output generation circuit since when it turns on, it

TABLE III

| Cell | Power (μW) @1 V, 1 GHz | | Delay (ps) @1 V | | Power × Delay (10⁻¹² J) | | IC area (μm × μm) | |
|---|---|---|---|---|---|---|---|---|
| | SAQDI | PCHB | SAQDI | PCHB | SAQDI | PCHB | SAQDI | PCHB |
| 1-bit Buffer | 1× (7.1) | 3.37× | 1× (147) | 1.38× | 1× (1.04) | 4.65× | 1× (5 × 4.6) | 1.09× |
| 2-bit AND/NAND | 1× (11.4) | 2.74× | 1× (196) | 1.36× | 1× (2.23) | 3.72× | 1× (5 × 5.4) | 1.07× |
| 2-bit OR/NOR | 1× (11.1) | 2.82× | 1× (190) | 1.40× | 1× (2.34) | 3.95× | 1× (5 × 5.4) | 1.07× |
| 2-bit XOR/XNOR | 1× (12.1) | 2.61× | 1× (244) | 1.15× | 1× (2.95) | 3.00× | 1× (5 × 6.6) | 1.06× |
| 2-bit MUX/IMUX | 1× (14.1) | 2.61× | 1× (272) | 1.13× | 1× (3.84) | 2.95× | 1× (5 × 6.6) | 0.97× |
| 3-bit AO/AOI | 1× (13.8) | 2.65× | 1× (245) | 1.22× | 1× (3.38) | 3.23× | 1× (5 × 7.8) | 1.08× |
| Average | 1× (11.6) | 2.80× | 1× (216) | 1.27× | 1× (2.63) | 3.58× | 1× (5 × 6.1) | 1.06× |

From Table III, it can be seen that the cells based on the SAQDI cell 600 significantly outperform the cells based on the PCHB cell. In particular, as compared to the cells based on the PCHB cell, the cells based on the SAQDI cell 600 dissipate lower power and have higher speeds (and hence, better power-delay products). The cells based on the SAQDI cell enables the sense-amplifier block's 704 amplification process by shorting the virtual supply voltage $V_{DD\_v}$ to the supply voltage $V_{DD2}$. In contrast, circuits for addressing the "input completeness" issue and output generation circuits in prior art QDI cells are often separate entities. This difference allows the SAQDI cell 600 to have lower IC area requirements and a lower transistor count (and hence, lower propagation delay) as compared to the prior art QDI cells.

Figure 13:
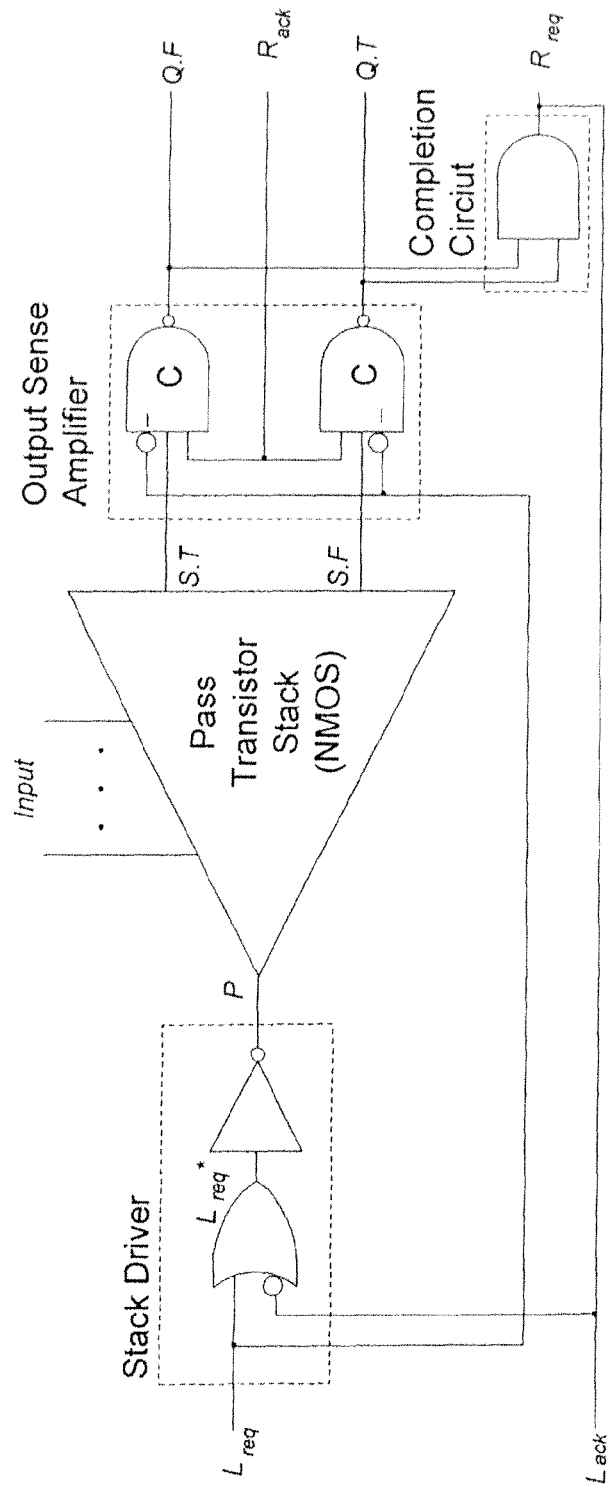
FIG. 13 shows a cell based on the prior art SAPTL approach.

Note that although the SAPTL approach reported by T.-T Liu et al in reference [19] also uses a sense-amplifier, the design principle and usage of this sense-amplifier is completely different from that of the sense-amplifier block 704 in the SAQDI cell 600. In particular, FIG. 13 shows a SAPTL library cell. The SAPTL library cell comprises four separate sub-blocks, namely the Stack Driver, the Pass Transistor Stack, the Output Sense-Amplifier and the Completion Circuit. As shown in FIG. 13, the Output Sense-Amplifier includes merely two asymmetric C-Muller gates for sensing the outputs from the Pass Transistor Stack and for latching these outputs, with each C-Muller gate configured to amplify one of the outputs from the Pass Transistor Stack. The main motivation of the SAPTL cell is to reduce leakage current and the Output Sense-Amplifier in this cell is not configured to detect a valid logic input to the SAPTL cell. In contrast, the sense-amplifier block 704 in the SAQDI cell 600 is configured to detect a valid logic input to the SAQDI cell 600 and amplify the difference in the output signals generated by the evaluation block 702 upon detection of the valid logic input. Further, although the SAPTL cell also uses dual-rail encoding, it is not fully QDI as some implicit timing assumptions are required. Therefore, it is not as operationally robust as compared to the SAQDI cell 600.

Figure 1:
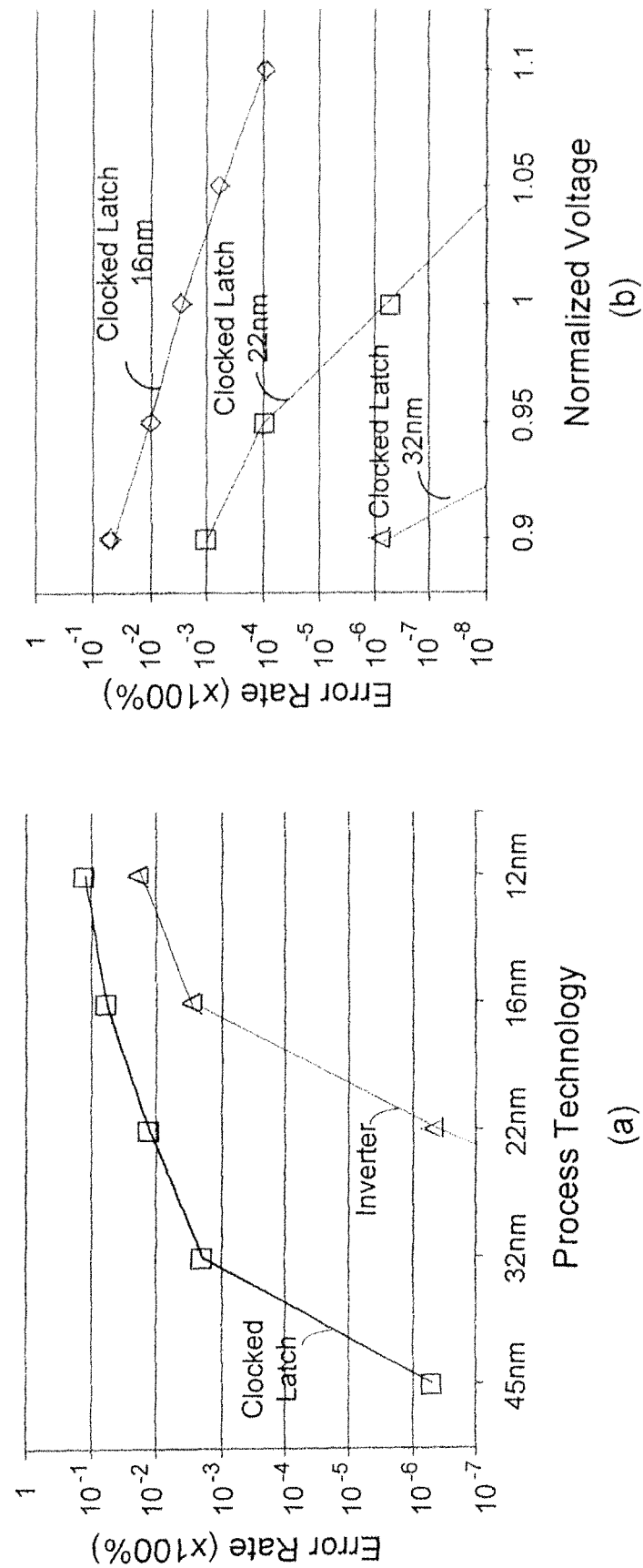
FIGS. 1(a)-(b) show possible soft error rates of two digital circuit types if these digital circuit types are fabricated using current and possible future fabrication process technologies.
Figure 2:
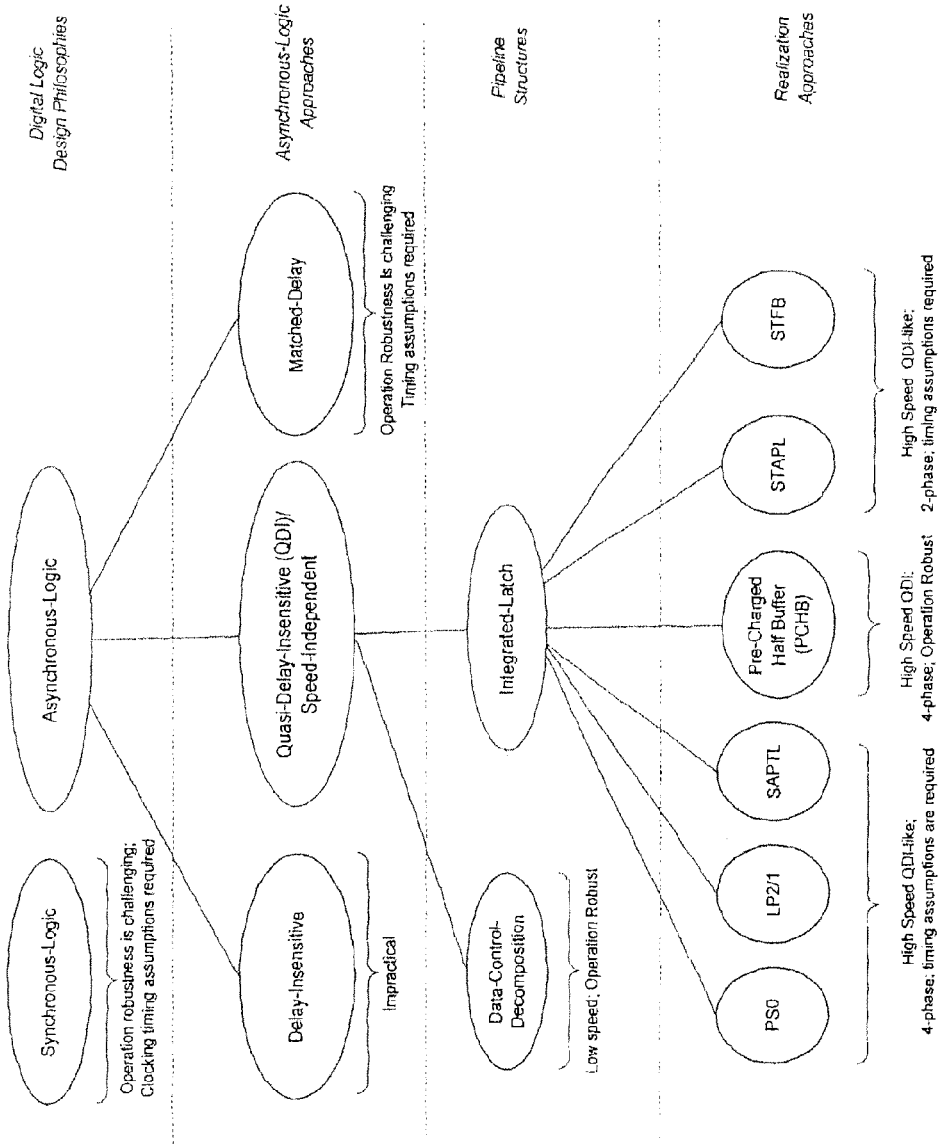
FIG. 2 shows the categorization of prior art design techniques for implementing digital circuits.
Figure 3:
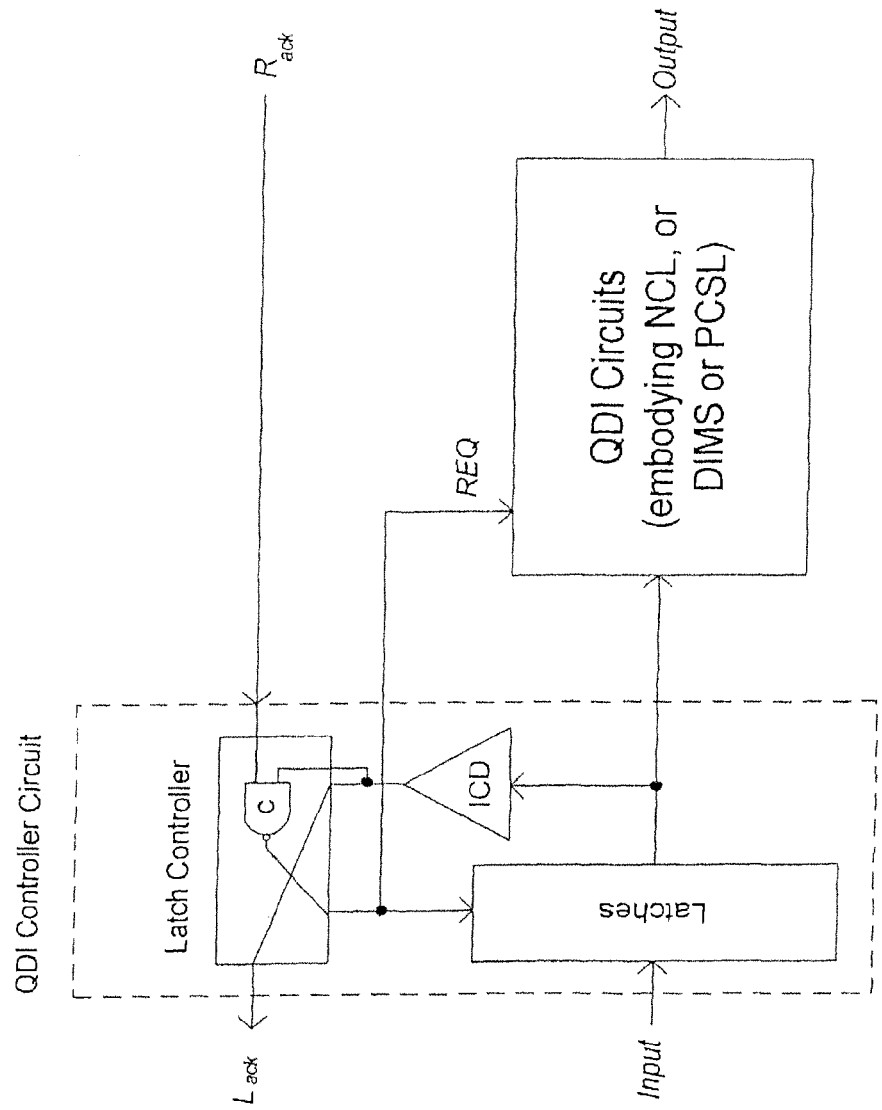
FIG. 3 shows a block diagram of a first pipeline structure (Data-Control Decomposition pipeline structure) in which QDI circuits can be adopted.
Figure 4:
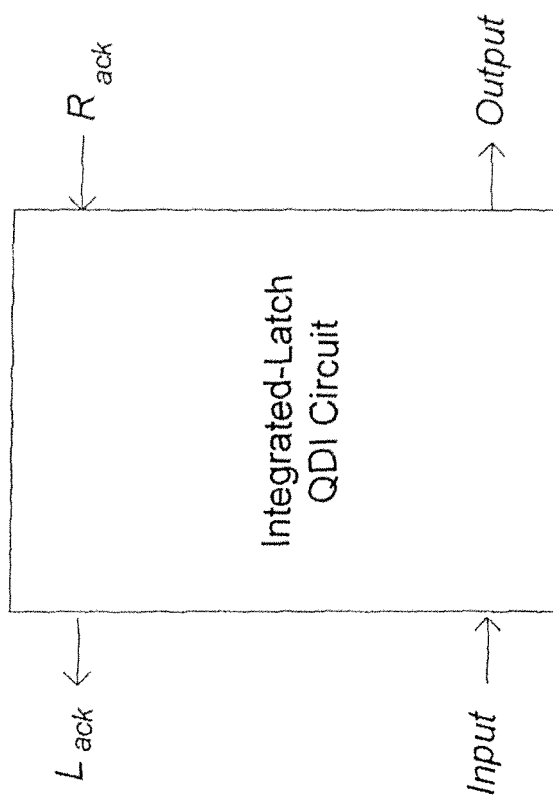
FIG. 4 shows an example circuit in a second pipeline structure (Integrated-Latch pipeline structure) in which QDI circuits may be adopted.
Figure 5:
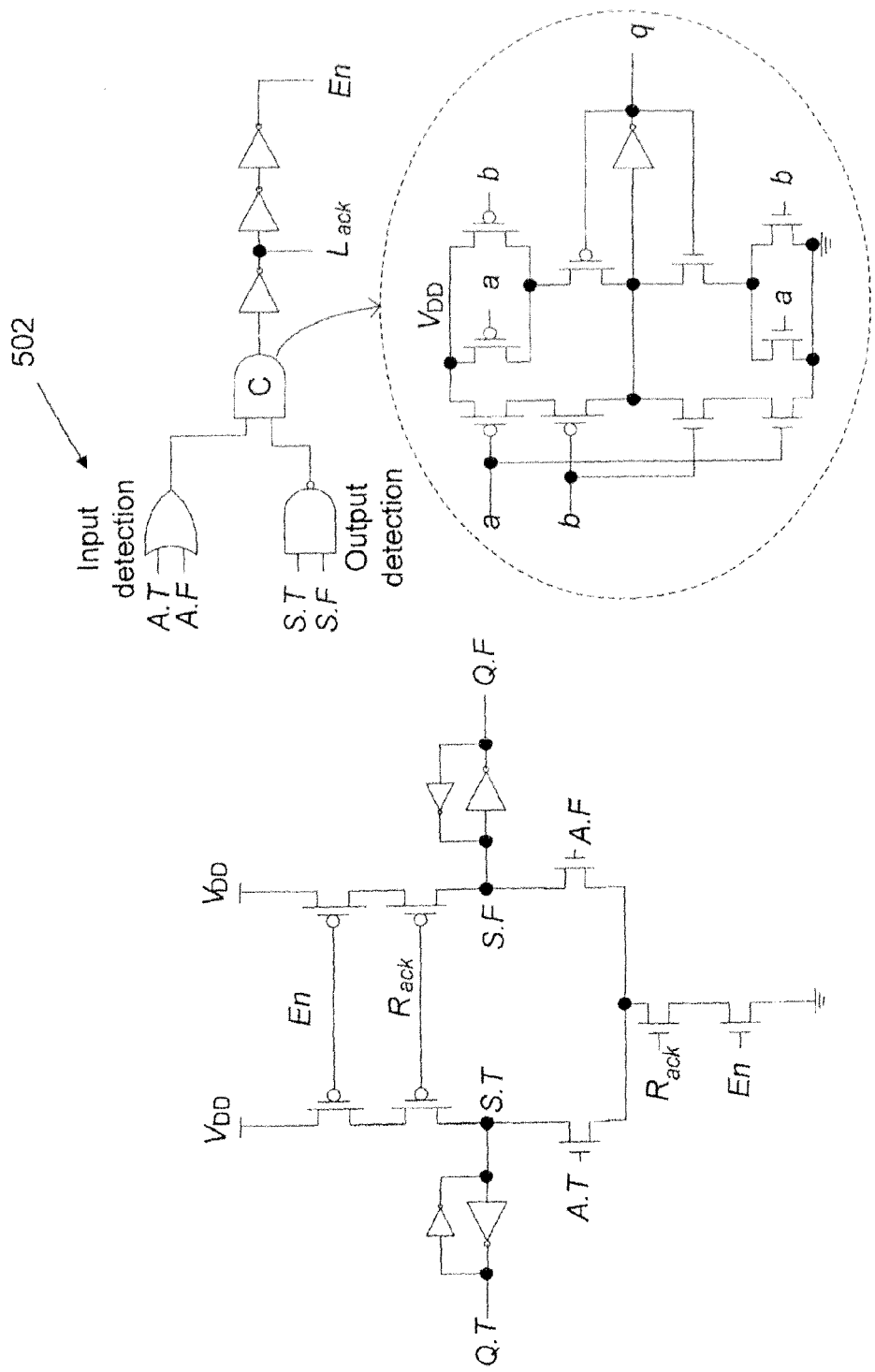
FIG. 5 shows a buffer cell based on the prior art PCHB approach.

In the SAQDI cell 600, the circuits required to implement the handshake protocol are distributed between the evaluation block 702 and the sense-amplifier block 704. This enables the sharing of common signals and allows the circuitry in each block 702, 704 to be used for both the handshake operations and the evaluation/amplification operations. This reduces the total amount of circuitry required to perform all the operations and in turn further reduces the IC area requirements and the transistor count of the SAQDI cell 600. For example, the buffer cell, shown on FIG. 8, based on the SAQDI cell 600 requires 34 transistors while the buffer cell, shown in FIG. 5, based on the PCHB cell requires 44 transistors. This is despite that the SAQDI cell 600 generates and uses complementary signals such as nInput, $nR_{ack}$ whereas the PCHB cell does not. The evaluation block 702 and sense-amplifier block 704 are also tightly coupled according to the handshake protocol. In particular, both the evaluation and reset operations of the cell 600 are performed via the cooperation of the evaluation and sense-amplifier blocks 702, 704 as described above. This tight coupling between the evaluation and sense-amplifier blocks 702, 704 helps to reduce the power dissipation and increase the speed of the SAQDI cell 600.

The lower transistor count of the SAQDI cell 600 (achieved due to the various reasons as mentioned above) in turn reduce the power consumption, power dissipation and EMI of the cell 600. These lower power consumption, power dissipation and EMI are also achieved because of the lower number of switching nodes (hence, a lower rate of change current) in the SAQDI cell 600 and the more effective switched capacitance of the SAQDI cell 600.

Moreover, the evaluation block 702 of the SAQDI cell 600 can be implemented using only NMOS transistors. This is advantageous as a pull-up network comprising only NMOS transistors features lower parasitic capacitances as compared to a pull-up network comprising PMOS transistors. Furthermore, a pull-up network comprising PMOS transistors has a transistor sizing of at least 2× larger than that of a pull-up network comprising only NMOS transistors. Hence, implementing the pull-up network 706 using only NMOS transistors helps to reduce the IC area requirements of the cell 600.

The SAQDI cell 600 has a further advantage in that the evaluation block 702 and the sense-amplifier block 704 can be powered by separate power supplies. This allows the supply voltages of the blocks 702, 704 to be adjusted independently (each supply voltage can be adjusted within a wide voltage range). For example, the supply of the evaluation block 702 can be adjusted from 0.2V to 1.2V, and that of the sense-amplifier block 704 can be adjusted from 0.5V to 1.2V. This is advantageous because the speed of the SAQDI cell 600 depends more on the operation of the sense-amplifier block 704 than that of the evaluation block 702. In particular, the evaluation block 702 does not need to generate a full-voltage swing, so the speed of the SAQDI cell 600 does not decrease greatly even when the evaluation block 702 is powered at a lower supply voltage. On the other hand, the sense-amplifier block 704 needs to amplify the difference in the output signals from the evaluation block 702 fast and is hence preferably powered at a higher supply voltage. Therefore, by allowing the evaluation block 702 and the sense-amplifier block 704 to be powered by separate power supplies, the evaluation block 702 can be powered at a lower supply voltage to reduce the power consumption, power dissipation (including dynamic and leakage power) and EMI of the SAQDI cell 600, whereas the sense-amplifier block 704 can be powered at a higher supply voltage to maintain the speed of the SAQDI cell 600.

Applications of the SAQDI Cell 600

The SAQDI cell 600 can be used to implement many types of digital cells, circuits and systems, for example, the cells those shown in Table III, the rudimentary 1-bit full adder, any word-length adder (including carry ripple adder, carry-select adder, carry-look-ahead adder, etc.), any word-length multiplier and any word-length divider etc. Furthermore, although the SAQDI approach is based on asynchronous-logic, the cells implemented based on the SAQDI cell 600 can also be used in synchronous-logic circuits and systems, or hybrid synchronous/asynchronous-logic circuits and systems. In fact, the SAQDI cell 600 can be used in not just digital systems but also mixed-signal systems comprising both digital circuits and analog circuits (in particular, the digital circuits in such systems can comprise one or more cells based on the SAQDI cell 600).

Moreover, the SAQDI cell 600 can be used in many commercial applications. Because of the advantages of the SAQDI cell 600 as mentioned above, the SAQDI cell 600 is particularly useful in today's applications which require not only operational robustness and speed, but also low power dissipation and low EMI. For example, the SAQDI cell 600 can be used to implement Network-on-Chips (NoCs), computers, servers, routers, military sensing devices, printed electronics and spintronic devices as elaborated below.

NoCs are used to provide the communication between intellectual property (IP) cores and system-on-chips (SoCs) within large VLSI systems implemented on a silicon chip. The key design issues of NoCs usually relate to achieving robust data synchronization, high speed and low power dissipation. Currently, many of the NoCs are implemented using asynchronous-logic as this can provide innate switching activity detection and hence, low standby power dissipation when the NoCs are inactive. Since the SAQDI cell 600 is based on asynchronous-logic, and is robust, fast and has low power dissipation, it is particularly useful for the implementation of NOCs.

Similar to the NoCs, the key design issues of multi-core microprocessors (for current and next-generation high-performance personal computers and/or servers) relate to achieving robust data synchronization, high speed and low power dissipation. Particularly, asynchronous-logic serves as a better design platform for multi-core microprocessors as it is becoming more and more challenging to employ synchronous-logic to achieve inter-core and intra-core data synchronization. Therefore, the SAQDI cell 600 is also useful for implementing multi-core microprocessors.

Another application of the SAQDI cell 600 pertains to remote-control or wireless applications. In particular, some remote sensors are activated only over a short period of time and remain idle for the rest of the time. During the short period of time when the remote sensors are activated, the digital circuits in these remote sensors have to compute the required logic operations as fast as possible. The remote sensors have to then become idle again and the whole process is preferably done without dissipating or wasting too much power. Since the SAQDI cell 600 is fast and has low power dissipation, it can be used to implement such remote sensors.

The SAQDI cell 600 is also extremely useful in implementing military and security applications. As mentioned above, besides the usual high speed and low power attributes, military and security applications also often require ultra low EMI to prevent hackers from deciphering security information present in these applications. Due to the low EMI of the SAQDI cell 600, the SAQDI cell 600 can be used to meet the ultra low EMI requirements of the military and security applications.

Furthermore, the SAQDI cell 600 can be used to improve the performance of printed electronics. In particular, printed electronics use printing technology instead of lithography technology for making active devices (e.g. transistors and diodes) and interconnect wires. Although this can lower the fabrication cost, the variability in the active devices and wires formed using current printed electronics technology is high and thus, the variability in the resulting digital circuits is high. Since the SAQDI cell 600 is operationally robust and insensitive to variations, using the SAQDI cell 600 in digital circuits implemented using the printed electronics technology can help improve the performance of these digital circuits.

The SAQDI cell 600 can also be used to improve the performance of spintronics devices. In particular, spintronics technology uses magnetic force to spin electrons for storing and sending information. Although there are advantages in using spintronics technology for implementing digital circuits, the PVT variations in the resulting digital circuits are usually high. Since the SAQDI cell 600 is operationally robust and insensitive to variations, using the SAQDI cell 600 in digital circuits implemented using spintronics technology can also help improve the performance of these digital circuits.

Variations to the SAQDI Cell 600

Although a few embodiments of the invention have been described in detail above, it is to be understood that many variations are possible within the scope of the invention, as defined by the claims. These variations also have the advantages of the SAQDI cell 600 as described above and can also be used for the applications as described above. A few examples of such variations are given below.

For example, although the SAQDI cell 600 uses '0' reset encoding (whereby A.T, A.F, Q.T, Q.F are considered empty when they are at logic '0'), the SAQDI cell 600 may easily be modified to use the '1' reset encoding (whereby A.T, A.F, Q.T, Q.F are considered empty when they are at logic '1') instead. Furthermore, the SAQDI cell 600 may also be modified such that the handshake signals are considered asserted when the primary handshake signals $R_{ack}$, $L_{ack}$ are at logic '0' and the complementary handshake signals $nR_{ack}$, $nL_{ack}$ are at logic '1'.

In addition, although the SAQDI cell 600 is configured to receive an input handshake signal (comprising primary and complementary right-channel handshake signals $R_{ack}$, $nR_{ack}$) and to provide an output handshake signal (comprising primary and complementary left-channel handshake signals $L_{ack}$, $nL_{ack}$), the SAQDI cell 600 can be varied to receive and/or provide more handshake signals. The handshake protocol of such a variant will be similar to that of the SAQDI cell 600 except that it uses more handshake signals. The SAQDI cell 600 can also be varied to use only $R_{ack}$ (without $nR_{ack}$) for its handshake protocol by using one or more PMOS transistors in the pull-up network 706.

Moreover, the evaluation block 702 of the SAQDI cell 600 does not have to comprise a pull-up network and a pull-down network. Other types of circuits capable of generating output signals based on the logic input and the logic operation can also be used. A variant of the SAQDI cell 600 which does not generate or use the complementary logic outputs nQ.T, nQ.F may also be implemented by modifying the evaluation block 702 and the sense-amplifier block 704 of the SAQDI cell 600 accordingly. The reset circuit in the SAQDI cell 600 can also be implemented with circuit structures different from the one shown in FIG. 8(a). In fact, the reset circuit can even be absent if the cell is configured such that it will certainly be in the reset state when powered on.

Figure 14:
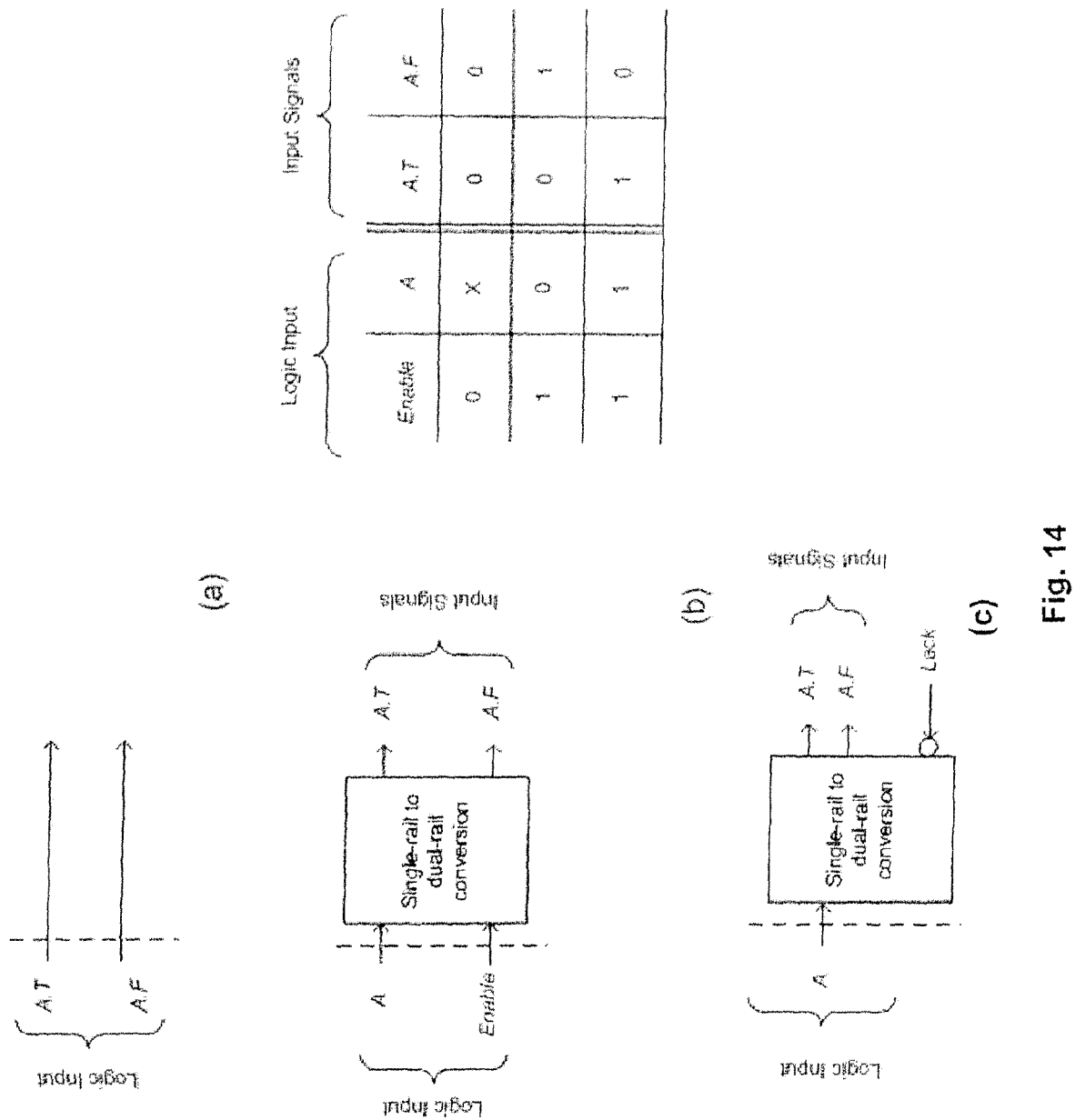
FIG. 14, which is composed of FIGS. 14(a)-14(c), shows three different ways in which the logic input can be used to generate the input signals in embodiments of the invention.

Yet furthermore, the embodiment of the invention presented above can be re-designed with different input encoding styles. FIG. 14(a) shows schematically the scheme of the embodiment above, in which the logic input is in a dual-rail representation and exactly the same as the input signals fed to the evaluation block and sense amplifier block. In this case, both the logic input and the input signals may be said to encode data. However, in variants of the invention, the logic input to the SAQDI can be represented either a single-rail or a multi-rail (N>1) data representation. In some cases, an input decoding circuit is required to decode the inputs such that the outputs of the input decoding circuit encode data that can be recognized by the SAQDI cell. Thus, as shown in FIG. 14(b), the logic input is input to a single rail to dual rail conversion input decoding circuit, which uses the truth table at the right of FIG. 14(b). Furthermore, for the single-rail data representation, the logic input may not necessarily encode data. Thus, as shown in FIG. 14(c) the logic input is not enough of its own to generate the input signals, but $L_{ack}$ is also used by the input decoding circuit. For the multi-rail data representation, the inputs may encode data representations different from (and including) the dual-rail encoding. Put simply, the encoding of the input to the SAQDI may be directly from the input logic itself, or using input signals derived at least partly from them.

Furthermore, although the embodiment presented above is fully QDI-compliant, variants of the embodiment can be used in circuits having timing assumptions. For example, although the SAQDI cell 600 is fully QDI, a variant of the SAQDI cell 600 which works in a manner similar to that of the SAQDI cell 600 but uses further timing assumptions (beyond just the "isochronic forks" assumption) may be implemented. Also, although the SAQDI cell 600 uses dual-rail encoding, it can be modified to use multi-rail encoding (i.e. N-rail encoding where N>2).

REFERENCES

1. J. T. Doyle et al, "All Digital Power Supply System and Method that Provides a Substantially Constant Supply Voltage over Changes in PVT without a Band Gap Reference Voltage," U.S. Pat. No. 6,870,410, 22 Mar. 2005.

2. J. S. Chang, B.-H. Gwee and K.-S. Chong, "Asynchronous-Logic for Full Dynamic Voltage Scaling," U.S. Provisional Patent No. 61/364,478.
3. G. E. Sobelman et al, "NULL Convention Threshold Logic," U.S. Pat. No. 6,900,658, 31 May 2005.
4. A. Martin et al, "Circuit Implementations for Asynchronous Processors," U.S. Pat. No. 6,152,613, 28, Nov. 2000.
5. J. M. Rabeay et al, *Digital Integrated Circuits, A System Perspective.* 2nd Edition, Prentice Hall, 2001.
6. J. Sparso et al, *Principles of Asynchronous Circuit Designs, A Systems Perspective.* Kluwer Academic Publishers, 2001.
7. P. A. Berrel et al, *A Designer's Guide to Asynchronous VLSI.* Cambridge University Press, 2009.
8. I. V. Kourtev et al, *Timing Optimization for High-Speed Digital Circuits.* Springer, 2010.
9. M. J. W. Rodwell, "High Speed Integrated Circuit Technology, Towards 100 GHz Logic", World Scientific Publishing Company, 2008.
10. "Executive Summary" International Technology Roadmap for Semiconductors (ITRS), 2011.
11. J. Kwong et al, "A 65 nm Sub-Vt Microcontroller With Integrated SRAM and Switched Capacitor DC-DC Converter," IEEE Journal of Solid-State Circuits, v44, n1, 2009.
12. I. Chang et al, "Exploring Asynchronous Design Techniques for Process-Tolerant and Energy-Efficient Sub-threshold Operation," IEEE Journal of Solid-State Circuits, v45, n2, 2009.
13. J. T. Kao et al, "A 175-mV Multiply-Accumulate Unit using an Adaptive Supply Voltage and Body Bias Architecture," IEEE Journal of Solid-State Circuits, v37, n11, 2002.
14. A. Chandrakasan et al, "Technologies for Ultra Dynamic Voltage Scaling," Proceedings of the IEEE, v98, n2, 2010.
15. S. Mutoh et al, "1-V Power Supply High-speed Digital Circuit Technology with Multi threshold-Voltage CMOS," IEEE Journal of Solid-State Circuits, v30, n8, 1995.
16. L. Chang et al, "Practical Strategies for Power-Efficient Computing Technologies," Proceedings of the IEEE, v98, n2, 2010.
17. A. Martin et al, "Asynchronous Techniques for System-on-Chip Design," Proceedings of the IEEE, v94, n6, 2006.
18. J. S. Chang, B.-H. Gwee and K.-S. Chong, *Digital Asynchronous-Logic: Dynamic Voltage Control.* DARPA Technical Report HR0011-09-2-0006, 2010.
19. T.-T. Liu et al, "Asynchronous computing in Sense Amplified-Based Pass Transistor Logic," IEEE Trans. Very Large Scale Integr. (VLSI) Syst., v17, n7, 2009.
20. D. Pandini et al, "Clock Distribution Techniques for Low-EMI Design," Journal of Embedded Computing, 2009.
21. E. Beigne et al., "An asynchronous power aware and adaptive NoC based circuit," IEEE JSSC, v44, n4, pp. 1167-1177, April 2009.
22. R. D. Jorgenson et al. "Ultralow-power operation in sub-threshold regimes applying clockless logic," Proc. IEEE, v98, n2, pp. 299-314, February 2010.
23. K.-S. Chong et al., "Synchronous-logic and globally-asynchronous-locally-synchronous (GALS) acoustic digital signal processors," IEEE JSSC, v47, n3, pp. 769-780, March 2012.

The invention claimed is:

1. A digital cell for performing a logic operation on a logic input to produce a logic output, wherein the digital cell comprises an evaluation block and a sense-amplifier block, the evaluation block and the sense-amplifier block being configured to together generate output signals representative of the logic output, the logic input comprising at least one bit of data, the logic output comprising at least one bit of data,
both the evaluation block and the sense-amplifier block being configured to receive input signals representative of the logic input, and to detect when either said logic input or said input signals encode said at least one bit of data of the logic input such that the at least one bit of data of the logic input is valid or empty, and
wherein the digital cell is configured to alternate between a reset state and an evaluate state, such that:
(i) upon the digital cell being in the reset state, and when either said logic input or said input signals encode said at least one bit of data of the logic input such that the at least one bit of data of the logic input is valid, the digital cell is switched from the reset state to the evaluate state in which the evaluation block generates a difference in the output signals based on the logic input and the logic operation to be performed, and the sense-amplifier block amplifies said difference in the output signals, thereby producing valid output signals where the output signals encode said at least one bit of data of the logic output such that the at least one bit of data of the logic output is valid; and
(ii) upon the digital cell being in the evaluate state with the valid output signals, when either said logic input or said input signals encode said at least one bit of data of the logic input such that the at least one bit of data of the logic input is empty, the digital cell is triggered to switch from the evaluate state to the reset state.

2. A digital cell according to claim 1, wherein said at least one bit of data of the logic input comprises k bits of data where k is greater than 1, and wherein the alternating of the digital cell between the reset state and the evaluate state is further based on said k bits of data such that:
upon the digital cell being in the reset state, and when either said logic input or said input signals encode said k bits of data of the logic input such that all k bits of data are valid, the digital cell is switched from the reset state to the evaluate state; and
upon the digital cell being in the evaluate state, and when either said logic input of said input signals encode said k bits of data of the logic input such that all k bits of data are empty, the digital cell is triggered to switch from the evaluate state to the reset state.

3. A digital cell according to claim 1, wherein both the evaluation block and the sense-amplifier block are further configured to receive at least one input handshake signal, and wherein the alternating of the digital cell between the reset state and the evaluate state is further based on said at least one input handshake signal such that:
upon the digital cell being in the reset state, said at least one input handshake signal is negated; and
upon the digital cell being in the evaluate state, the digital cell is triggered to switch from the evaluate state to the reset state only when said at least one input handshake signal is asserted.

4. A digital cell according to claim 1, wherein the evaluation block comprises a pull-up network and a pull-down network, the pull-up and pull-down networks being configured to cooperate to generate the difference in the output signals.

5. A digital cell according to claim 1, wherein each bit of data of the logic input is encoded by either at least one respective pair of components of said logic input or at least one respective pair of said input signals, and the difference generated by the evaluation block between the output signals is smaller than a minimum voltage between any said pair of input signals.

6. A digital cell according to claim 1, wherein the evaluation block comprises only NMOS transistors.

7. A digital cell according to claim 1, wherein the sense-amplifier block comprises a completion circuit configured to generate an output handshake signal indicating validity of the output signals.

8. A digital cell according to claim 7, wherein after the digital cell is triggered to switch from the evaluate state to the reset state, the digital cell resets the output signals, thereby changing the output handshake signal.

9. A digital cell according to claim 1, wherein the logic output comprises logic data signals complementary to each other, and wherein the sense-amplifier block comprises complementary buffers for generating said logic output.

10. A digital cell according to claim 1, wherein the sense-amplifier block comprises an amplification circuit configured to produce the valid output signals and further configured to latch the valid output signals.

11. A digital cell according to claim 10, wherein the amplification circuit comprises:
    a holding circuit configured to produce and latch the valid output signals when turned on; and
    a feedback circuit configured to keep the holding circuit on if the output signals are valid and if the digital cell is not triggered to switch from the evaluate state to the reset state, thereby allowing the holding circuit to continue latching the valid output signals for as long as the digital cell is not triggered to switch from the evaluate state to the reset state.

12. A digital cell according to claim 11, wherein the holding circuit comprises cross-coupled inverters.

13. A digital cell according to claim 11 wherein the feedback circuit comprises only PMOS transistors.

14. A digital cell according to claim 11, wherein the amplification circuit comprises an input completeness circuit configured to turn on upon the sense-amplifier block detecting that either the logic input or the input signals encode said at least one bit of data of the logic input such that all bits of data of the logic input are valid, and wherein said turning on of the input completeness circuit amplifies the difference in the output signals of the evaluation block.

15. A digital cell according to claim 14, wherein the input completeness circuit comprises only PMOS transistors.

16. A digital cell according to claim 14, wherein said turning on of the input completeness circuit amplifies the difference in the output signals of the evaluation block by turning on the holding circuit.

17. A digital cell according to claim 1, wherein the evaluation block and sense-amplifier block are configured such that they can be powered by separate power supplies.

18. A digital cell according to claim 17, wherein the evaluation and sense-amplifier blocks are powered by separate power supplies and wherein the evaluation block is configured to receive the valid output signals from the sense-amplifier block and disconnect the output signals from its power supply.

19. A digital cell according to claim 17, wherein the evaluation block and sense-amplifier block are powered by separate power supplies which generate different voltage levels, and are configured such that before all bits of data of the logic input are valid, the evaluation block can generate the difference in the output signals but the sense-amplifier block is prevented from producing valid output signals.

20. A digital cell according to claim 1, wherein the evaluation block and sense-amplifier block are powered by the same power supply, and wherein the evaluation block is configured to generate the difference in the output signals only when all bits of data of the logic input are valid.

21. A digital cell according to claim 1, wherein the digital cell further comprises a reset circuit which can be activated to reset the output signals.

22. A digital cell according to claim 1, wherein the digital cell is based on Quasi-Delay-Insensitive asynchronous-logic.

23. A pipeline for performing logic operations on logic inputs to produce logic outputs, the pipeline comprising at least one digital cell according to claim 1.

24. A pipeline according to claim 23, wherein the pipeline is based on the Integrated-Latch pipeline structure.

* * * * *